(12) United States Patent
Chu et al.

(10) Patent No.: US 9,711,507 B1
(45) Date of Patent: Jul. 18, 2017

(54) SEPARATE N AND P FIN ETCHING FOR REDUCED CMOS DEVICE LEAKAGE

(71) Applicant: International Business Machines Corporation, Armonk, NY (US)

(72) Inventors: Isabel C. Chu, Melrose, NY (US); Lawrence A. Clevenger, LaGrangeville, NY (US); Leigh Anne H. Clevenger, Rhinebeck, NY (US); Mona A. Ebrish, Albany, NY (US); Gauri Karve, Cohoes, NY (US); Fee Li Lie, Albany, NY (US); Deepika Priyadarshini, Philadelphia, PA (US); Nicole A. Saulnier, Albany, NY (US); Indira P. Seshadri, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/281,970

(22) Filed: Sep. 30, 2016

(51) Int. Cl.
| | |
|---|---|
| *H01L 21/8238* | (2006.01) |
| *H01L 27/092* | (2006.01) |
| *H01L 21/308* | (2006.01) |
| *H01L 21/3105* | (2006.01) |
| *H01L 21/02* | (2006.01) |
| *H01L 29/10* | (2006.01) |

(52) U.S. Cl.
CPC .... *H01L 27/0924* (2013.01); *H01L 21/02521* (2013.01); *H01L 21/3081* (2013.01); *H01L 21/31051* (2013.01); *H01L 21/823807* (2013.01); *H01L 21/823821* (2013.01); *H01L 21/823878* (2013.01); *H01L 29/1033* (2013.01)

(58) Field of Classification Search
CPC ......... H01L 21/823821; H01L 27/0924; H01L 21/823807; H01L 21/845; H01L 27/1211; H01L 21/02532; H01L 21/823431; H01L 21/823814; H01L 29/16; H01L 29/161; H01L 29/165; H01L 21/02381; H01L 21/823864
See application file for complete search history.

(56) References Cited

U.S. PATENT DOCUMENTS

| | | |
|---|---|---|
| 7,993,999 B2 | 8/2011 | Basker et al. |
| 8,476,137 B1 | 7/2013 | Licausi et al. |
| 8,841,178 B1 | 9/2014 | Basker et al. |
| 8,901,615 B2 | 12/2014 | Moroz |
| 9,087,741 B2 | 7/2015 | Cheng et al. |
| 9,093,533 B2 | 7/2015 | Cheng et al. |
| 9,236,309 B2 | 1/2016 | Park et al. |
| 9,356,046 B2 | 5/2016 | Cheng et al. |
| 9,450,095 B1 | 9/2016 | Bergendahl et al. |

OTHER PUBLICATIONS

K. Cheng et al., "Strained Semiconductor Device," U.S. Appl. No. 15/195,251, filed Jun. 28, 2016.

*Primary Examiner* — Robert Bachner
(74) *Attorney, Agent, or Firm* — Cantor Colburn LLP; Vazken Alexanian

(57) ABSTRACT

A method for forming a semiconductor device includes blocking a first region of a wafer and forming a plurality of fins in a second region of the wafer. A protective conformal mask layer is deposited over the plurality of fins in the second region, the second region is blocked, and a plurality of fins are formed in the first region of the wafer using a variety of wet and/or dry etching procedures. The protective conformal mask layer protects the plurality of fins in the second region from the variety of wet and/or dry etching procedures that are used to form the plurality of fins in the first region.

14 Claims, 26 Drawing Sheets

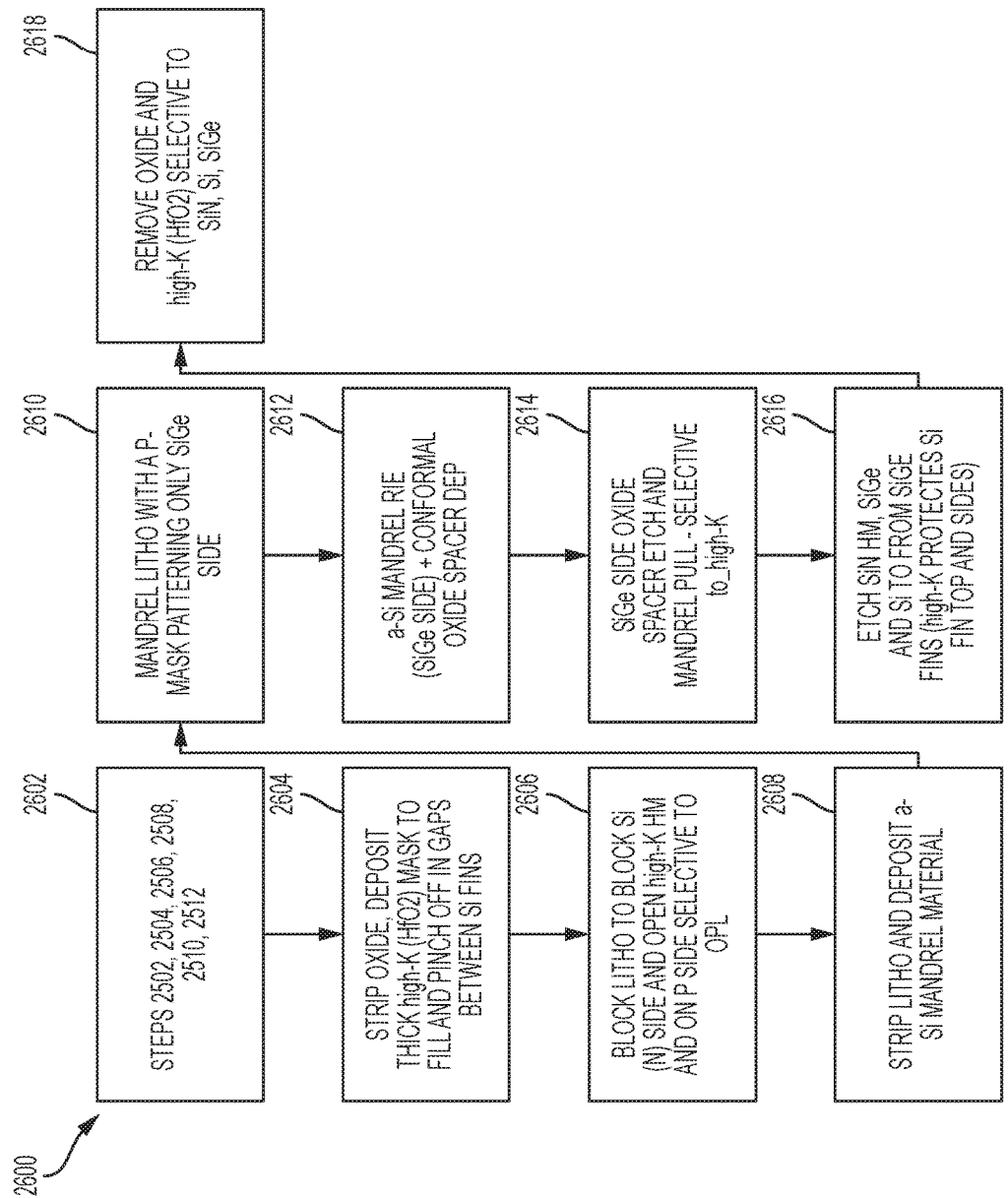

SEPARATE N AND P FIN ETCHING FOR REDUCED CMOS DEVICE LEAKAGE

BACKGROUND

The present invention generally relates to complimentary metal-oxide semiconductors (CMOS) and metal-oxide-semiconductor field-effect transistors (MOSFET), and more specifically, to fin-type field effect transistor (FinFET) device architecture.

The MOSFET is a transistor used for switching electronic signals. The MOSFET has a source, a drain, and gate electrode. The gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and includes n-doped source and drain junctions. The pFET uses holes as the current carriers and includes p-doped source and drain junctions.

Device scaling in the semiconductor industry reduces costs, decreases power consumption, and provides faster devices with increased functions per unit area. Improvements in optical lithography have played a major role in device scaling. However, optical lithography has limitations for minimum dimensions and pitch, which are determined by the wavelength of the radiation.

SUMMARY

According to an embodiment of the present invention, a method for forming a semiconductor device includes blocking a first region of a wafer and forming a plurality of fins in a second region of the wafer. A conformal mask layer is deposited over the plurality of fins in the second region. The first region is unblocked, and the second region is blocked. A plurality of fins in the first region of the wafer is formed. The second region is unblocked, and the conformal mask layer is removed.

According to another embodiment, a semiconductor device includes a first region that includes a first plurality of fins that include a substrate, a channel region, and a dielectric layer. The device also includes a second region that includes a second plurality of fins that include the substrate and the dielectric layer. A critical dimension of the first plurality of fins is substantially the same as a critical dimension of the second plurality of fins.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

FIG. 26 depicts a flow diagram illustrating another methodology according to one or more embodiments of the present invention.

DETAILED DESCRIPTION

Figure 1:
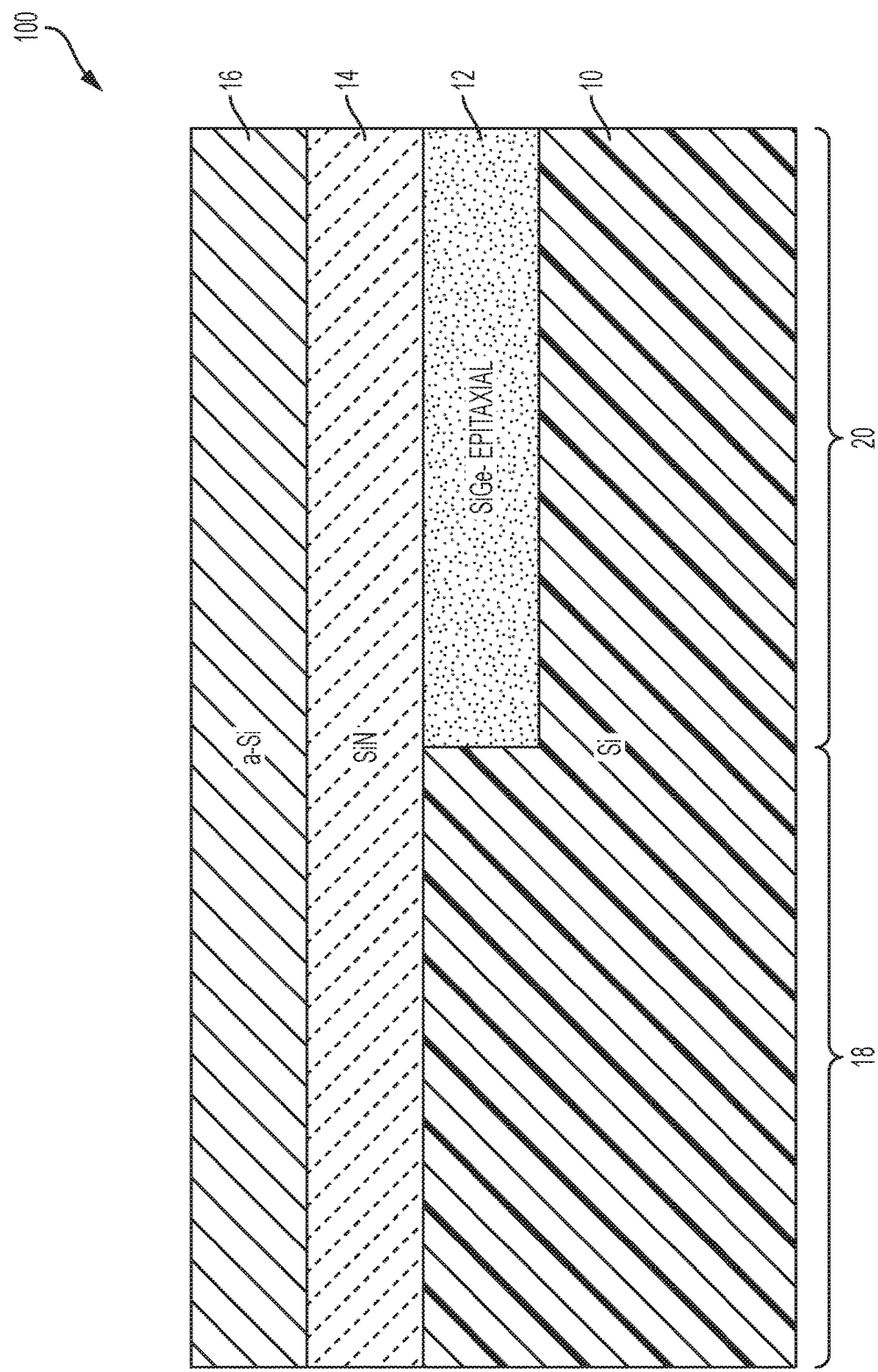
FIG. 1 depicts a cross-sectional view of a structure after an initial fabrication stage according to one or more embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

For the sake of brevity, conventional techniques related to semiconductor devices and fabrication methods may or may not be described in detail herein. Moreover, the various tasks and process steps described herein can be incorporated into a more comprehensive procedure or process having additional steps or functionality not described in detail herein. In particular, various steps in the manufacture of semiconductor devices are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping, and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators, and selectively doped regions are built up to form the final device.

Turning now to an overview of the present invention, the illustrated exemplary embodiments described herein provide unique methods for fabricating a semiconductor device, wherein the device includes a dual channel material having N-region and P-region fins with substantially the same vertical profiles and substantially the same critical dimensions. The phrase "critical dimension" and variations thereof are used herein to identify dimensions of semiconductor device features that can impact the performance of the device (e.g., increase parasitic capacitance, etc.). Critical dimensions are often adjusted using a variety of means in order to optimize device performance and yield in manufacturing. The semiconductor features that are considered critical dimensions depend on a variety of factors, including, for example, the specifics of the relevant process technologies.

According to one or more exemplary embodiments, the semiconductor device is fabricated in multiple steps wherein the N-region and the P-region are formed separately on the same wafer material. In part, the methods provides for the formation of an N-region and a P-region from dissimilar channel materials. While protecting the P-region, the n-type FinFETs are formed. The P-region is subsequently de-protected, and a conformal layer is deposited over the n-type FinFETs and the P-region. The N-region is subsequently protected. The conformal layer is then removed from the P-region, and, while protecting the N-region, the p-type FinFETs are formed. The conformal layer is then removed from the N-region, resulting in a wafer that includes a dual channel material having N-region and P-region fins with substantially the same vertical profiles and substantially the same critical dimensions. By protecting the P-region during formation of the n-type FinFETs, degradation of the materials included in the P-region can be minimized. Similarly, by protecting the N-region during the formation of the p-type FinFETs, degradation of the materials included in the N-region can be minimized.

In another exemplary embodiment, the semiconductor device can be fabricated in multiple steps wherein the p-type FinFETs are formed before the n-type FinFETs are formed.

Methods for fabricating the dual channel material in accordance with embodiments of the present invention are described in detail below by referring to the accompanying drawings in FIGS. 1-26. Specifically, FIG. 1 illustrates a cross-sectional view of a structure 100, which has been fabricated using conventional semiconductor device fabrication techniques. As shown, structure 100 includes a substrate 10 formed from a semiconductor material, a channel region 12, a dielectric layer 14, and a first amorphous silicon (a-Si) layer 16, configured and arranged as shown. Suitable materials for the layer 16 include materials having physical properties that are sufficient to withstand exposure to etch processes needed for later mandrel formation. An N-region 18 defines a region of the structure 100 in which an n-type FET (e.g., an n-type FinFET) will be formed. A P-region 20 defines a region of the structure 100 in which a p-type FET (e.g., a p-type FinFET) will be formed.

According to an exemplary embodiment, the channel region 12 can be grown epitaxially over the P-region 20 of the substrate 10. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ $cm^{-3}$ to $2\times10^{21}$ $cm^{-3}$, or between $2\times10^{20}$ $cm^{-3}$ and $1\times10^{21}$ $cm^{-3}$.

The terms "epitaxial growth and/or deposition" and "epitaxially formed and/or grown" mean the growth of a semiconductor material (crystalline material) on a deposition surface of another semiconductor material (crystalline substrate material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. An epitaxial germanium layer can be deposited from a germanium gas source that is selected from the group consisting of germane, digermane, halogermane, dichlorogermane, trichlorogermane, tetrachlorogermane, and combinations thereof. While an epitaxial silicon germanium alloy layer can be formed utilizing a combination of such gas sources. Carrier gases like hydrogen, nitrogen, helium, and argon can be used.

The semiconductor material of the substrate 10 can include, for example, silicon, germanium, and those consisting essentially of group III-V compounds. A portion or the entire substrate 10 can be amorphous, polycrystalline, or monocrystalline. The substrate 10 can be doped, undoped, or contain doped regions and undoped regions therein.

Examples of suitable channel materials for the channel region 12 include alloys such as a SiGe alloys, for instance $Si_{(1-x)}Ge_x$, wherein $0<x<1$. Other suitable channel materials include binary silicon alloys of the general formula $Si_{(1-x)}M_x$, wherein M is at least one of tin, boron, aluminum, gallium, indium, nitrogen, phosphorous, arsenic, antimony, and bismuth, and wherein $0<x<1$. Other binary alloys, including cadmium arsenide, cadmium antimonide, zinc phosphide, zinc arsenide, and zinc antimonide, are also suitable alloys. Ternary and quaternary alloys, such as indium gallium arsenide or aluminum indium gallium phosphide, may also be suitable.

Examples of suitable materials for the dielectric layer 14 include silicon oxide, silicon nitride, silicon oxynitride, boron nitride, high-k materials, or any combination of these materials. Examples of suitable high-k materials include metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum or aluminum.

Materials and material layers can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the materials can vary depending on the deposition process as well as the composition.

Figure 2:
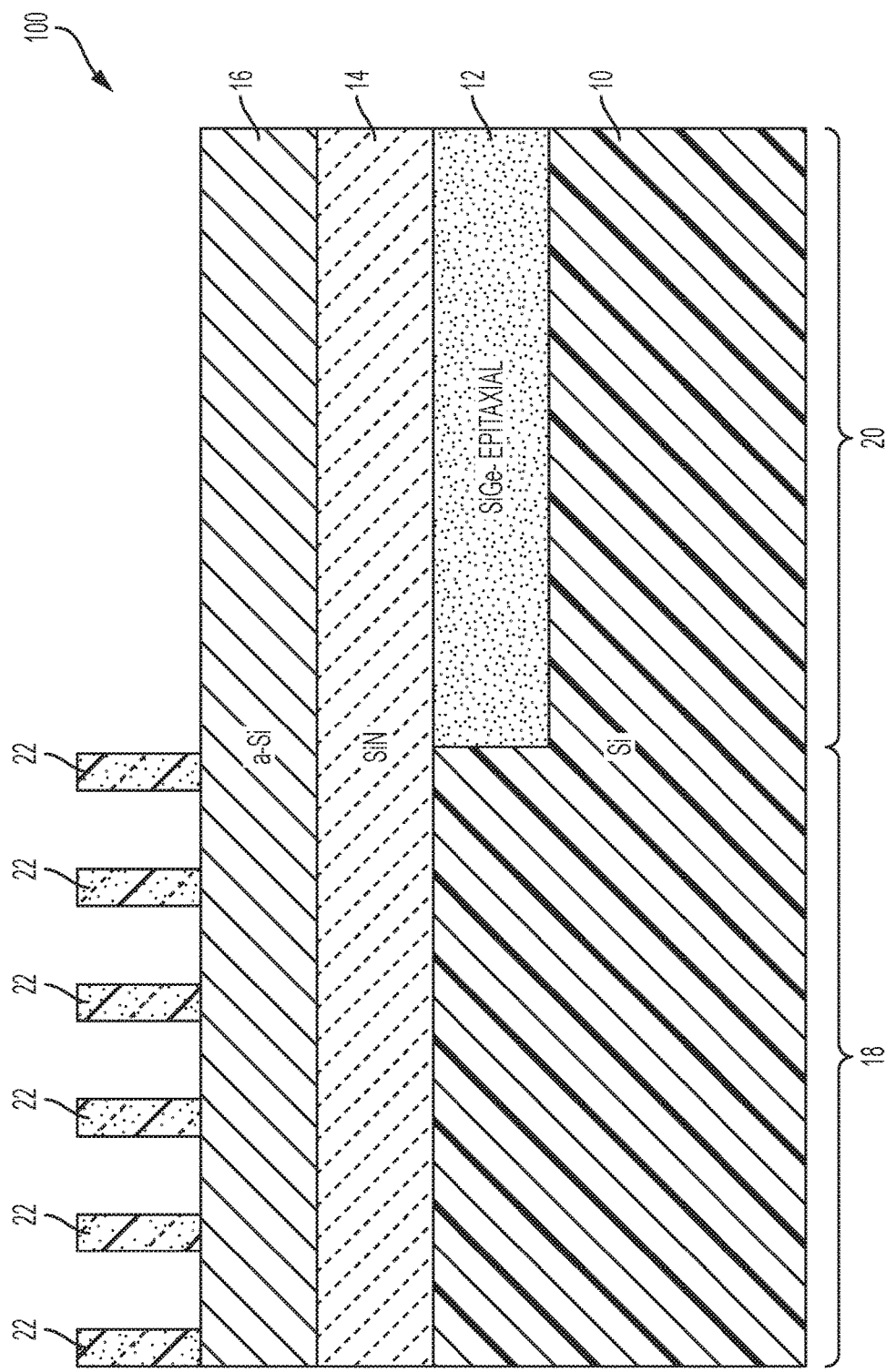
FIG. 2 depicts a cross-sectional view of the structure after an intermediary fabrication stage according to one or more embodiments of the present invention.

FIG. 2 illustrates a cross-sectional view of the structure 100 having mandrels 22 formed on the layer 16 in the N-region 18 of the structure 100. The mandrels 22 can include any suitable material and can be formed by any suitable method, such as lithography. For ease of illustration and description, only some of the mandrels 22 are depicted. However, it is understood that two or more mandrels 22 can be utilized. A variety of methods can be used to form the mandrels 22. In some embodiments, trenches between the mandrels 22 are formed using, for example, an anisotropic or dry etching technique, such as a reactive ion etching (RIE). RIE is a type of dry etching that uses chemically reactive plasma to remove a material, such as a masked pattern of a substrate, by exposing the material to a bombardment of ions that dislodge portions of the material from the exposed surface. The plasma is generated under low pressure (vacuum) by an electromagnetic field.

Figure 3:
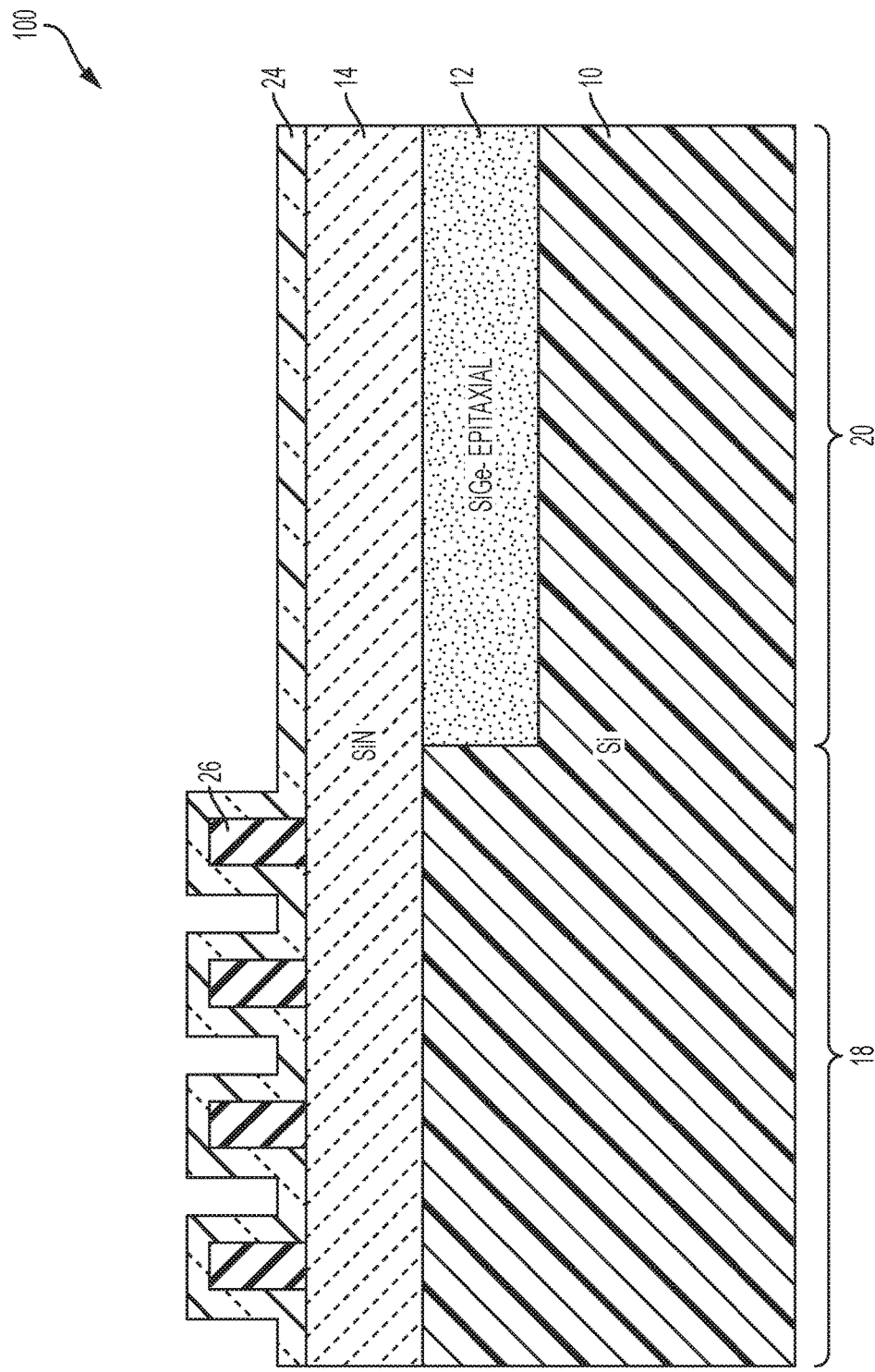
FIG. 3 depicts a cross-sectional view of the structure after an intermediary fabrication stage according to one or more embodiments of the present invention.

FIG. 3 illustrates a cross-sectional view of the structure 100 after patterning and etching the amorphous silicon layer 16 to form the amorphous silicon regions 26 in the N-region 18 to form the N-mask pattern. An oxide layer 24 was then conformally deposited over the N-mask pattern and over the P-region 20 of the structure 100. The conformal oxide layer 24 can be of any suitable material, such as, for example, an oxide, silicon dioxide, or silicon nitride. The manner of depositing the conformal oxide spacer 24 is not meant to be particularly limited. In some embodiments, the conformal oxide spacer 24 can be conformally formed using chemical vapor deposition (CVD), plasma-enhanced chemical vapor deposition (PECVD), atomic layer deposition (ALD), evaporation, physical vapor deposition (PVD), chemical solution deposition, or other like processes.

Figure 4:
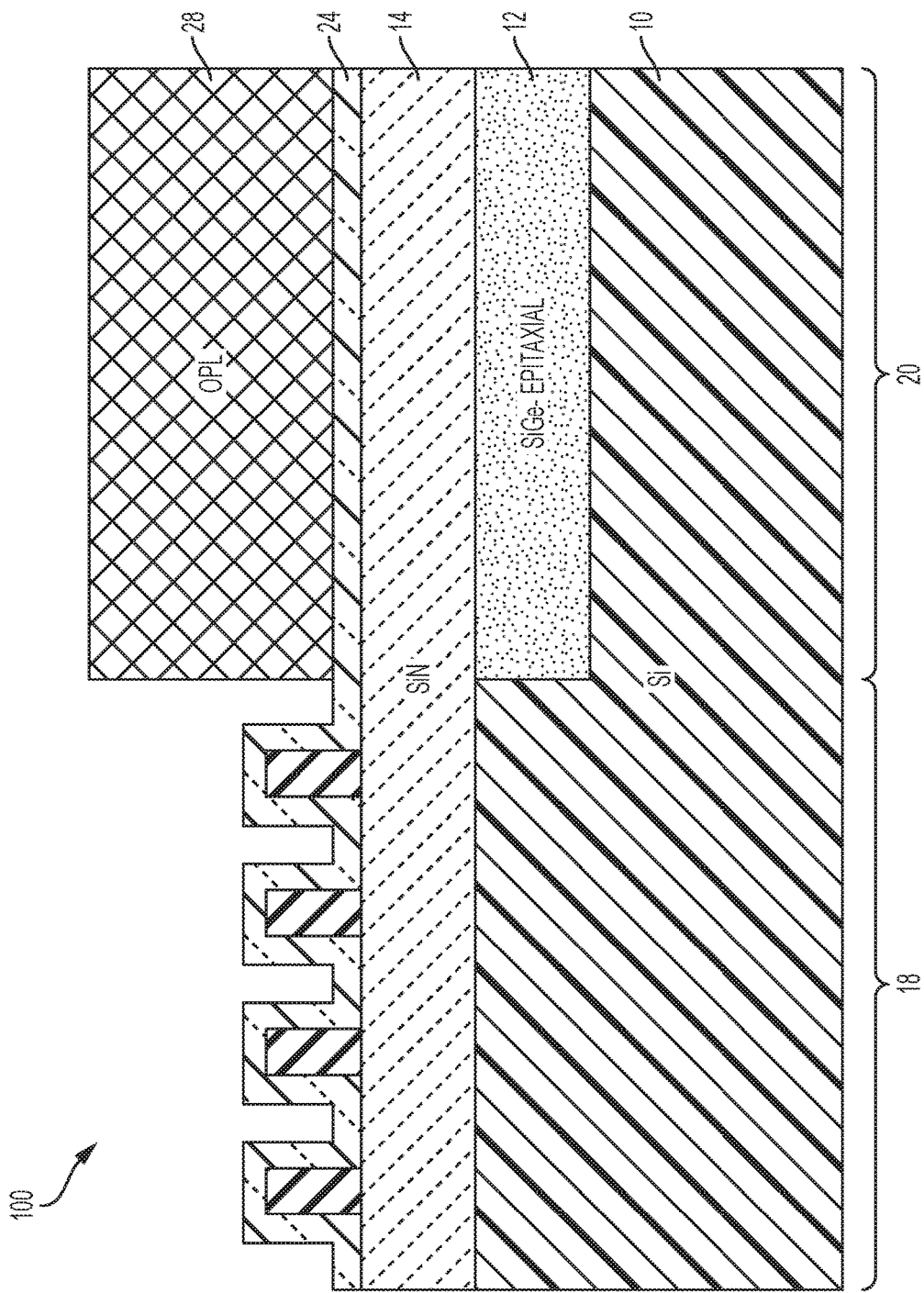
FIG. 4 depicts a cross-sectional view of the structure after an intermediary fabrication stage according to one or more embodiments of the present invention.

FIG. 4 illustrates a cross-sectional view of the structure 100 after an organic planarization layer (OPL) 28 has been deposited over the conformal oxide layer 24 to block the P-region 20 of the structure 100. Any suitable OPL material can be used, and the OPL can be applied using any suitable method. With the P-region 20 blocked, the N-region is selectively etched. Without being bound by theory, selectively etching the N-region 18 prevents the P-region 20 materials from being altered or damaged by the etching of the N-region 18.

Figure 5:
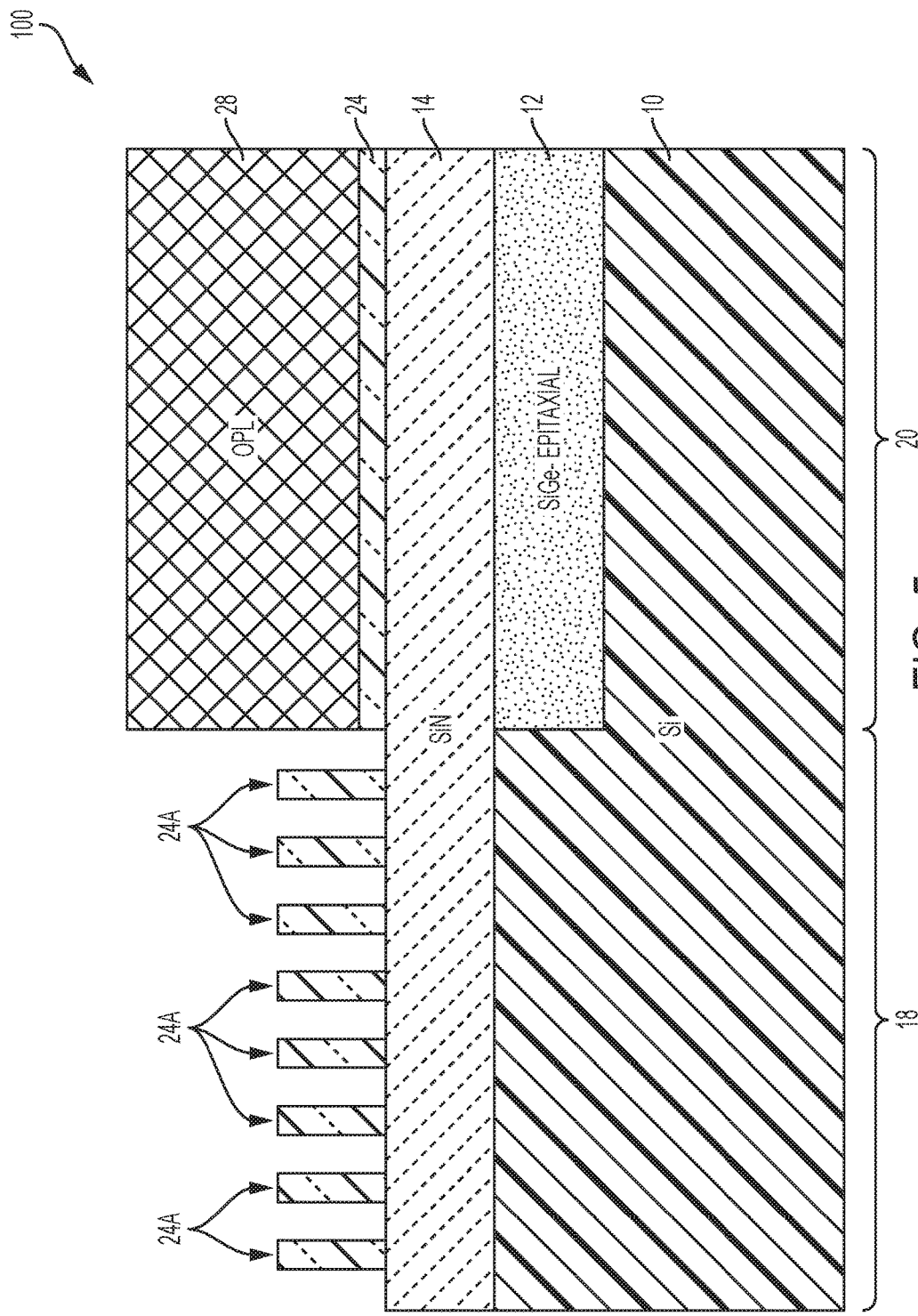
FIG. 5 depicts a cross-sectional view of the structure after an intermediary fabrication stage according to one or more embodiments of the present invention.

FIG. 5 illustrates a cross-sectional view of the structure 100 after the conformal oxide layer 24 has been etched back in the N-region 18 to form oxide pillars 24A, and the structure 100 has been subjected to a mandrel pull to remove the regions 26.

Figure 6:
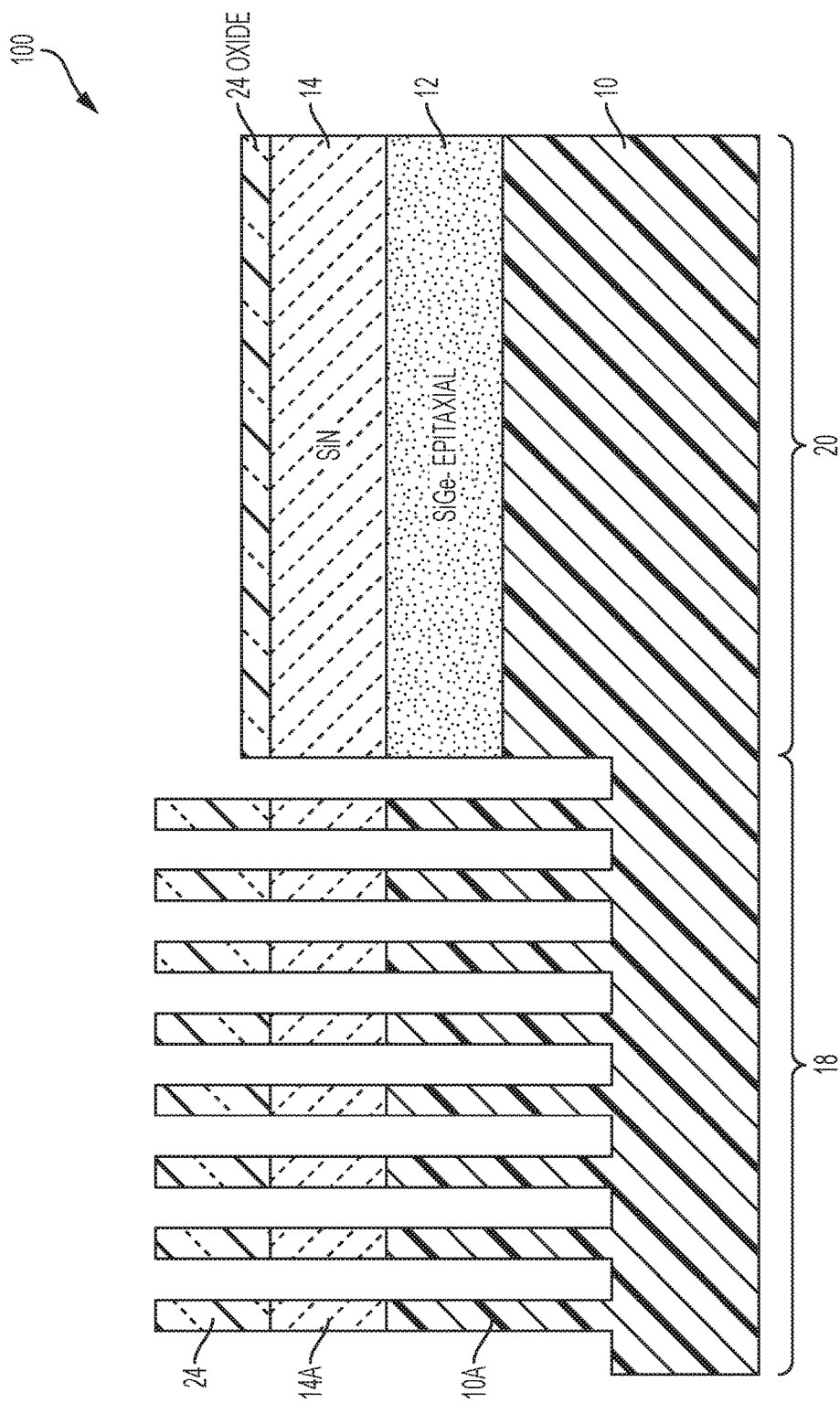
FIG. 6 depicts a cross-sectional view of the structure after an intermediary fabrication stage according to one or more embodiments of the present invention.

FIG. 6 illustrates a cross sectional view of the structure 100 after etching through the dielectric layer 14 and the substrate 10 to form amorphous silicon pillars 14A and N-region fins 10A in the N-region 18. Additionally, the organic planarization layer 28 has been removed from the P-region 20.

Figure 7:
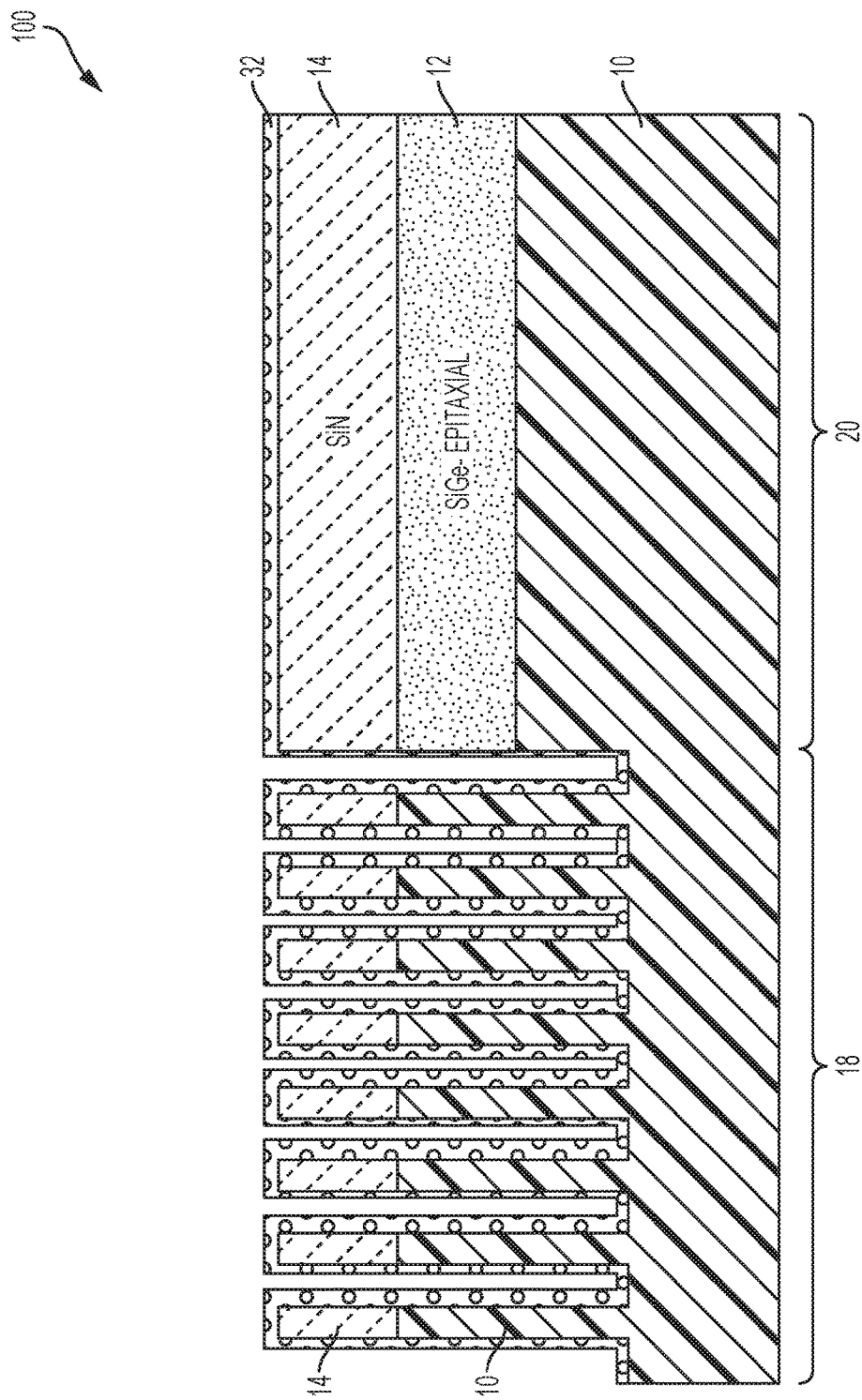
FIG. 7 depicts a cross-sectional view of the structure after an intermediary fabrication stage according to one or more embodiments of the present invention.

FIG. 7 illustrates a cross sectional view of the structure 100 after removal of the oxide layer 24 and the oxide pillars 24A from the N-region 18 and the P-region 20, and after depositing a conformal mask layer 32 over the structure 100 in the N-region 18 and the P-region 20. Any suitable methods can be used to remove the oxide layer 24 and the oxide pillars 24A and to deposit the conformal mask layer 32.

Examples of suitable materials for use in the conformal mask layer 32 include, but are not limited to, high-k materials such as metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum or aluminum.

Figure 8:
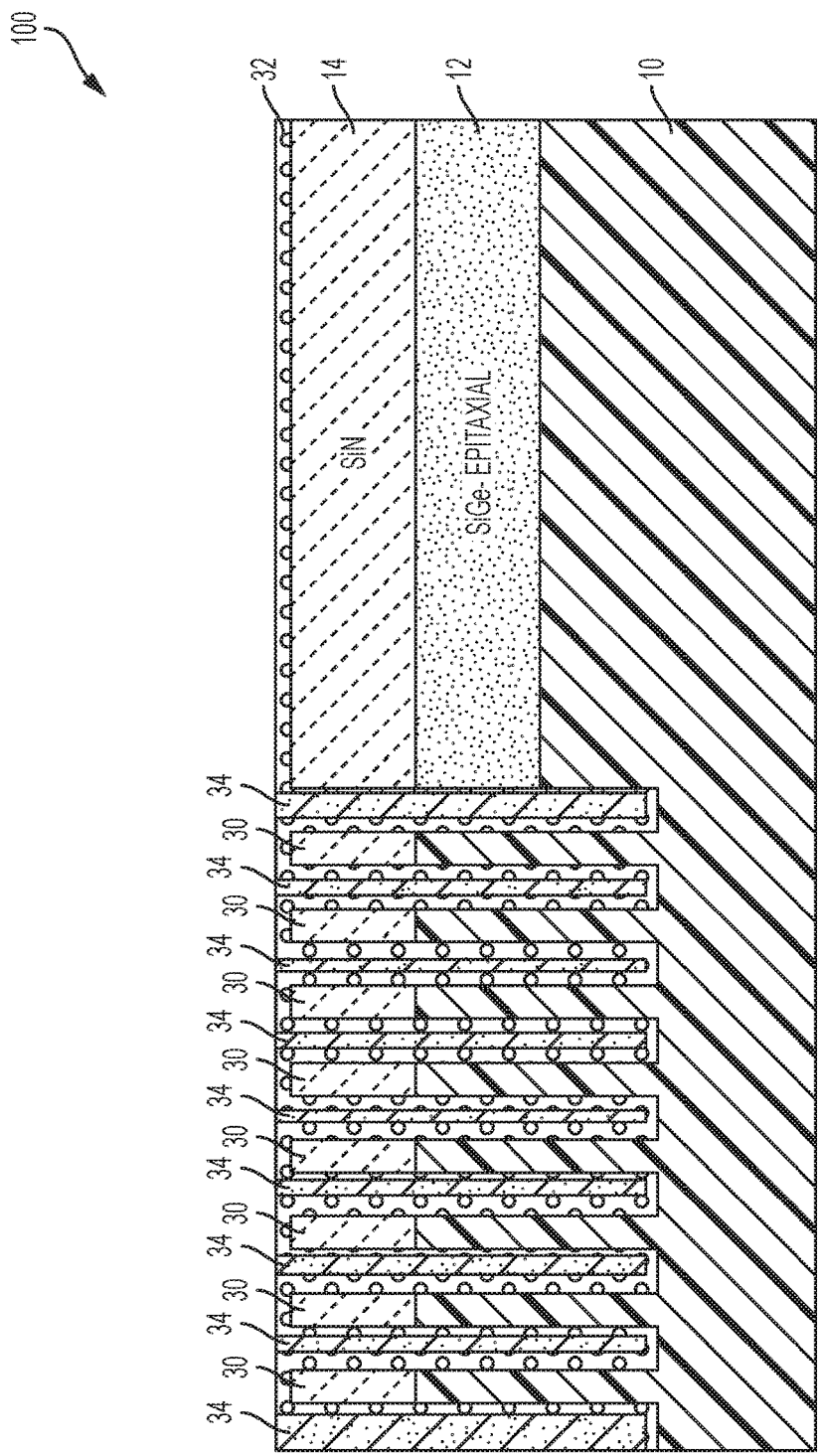
FIG. 8 depicts a cross-sectional view of the structure after an intermediary fabrication stage according to one or more embodiments of the present invention.

FIG. 8 illustrates a cross sectional view of structure 100 after an oxide fill 34 has been deposited in the regions between the N-region fins 10A. In some embodiments, the oxide fill 34 can be formed using chemical vapor deposition (CVD), plasma-enhanced chemical vapor deposition (PECVD), atomic layer deposition (ALD), evaporation, physical vapor deposition (PVD), chemical solution deposition, or other like processes.

Figure 9:
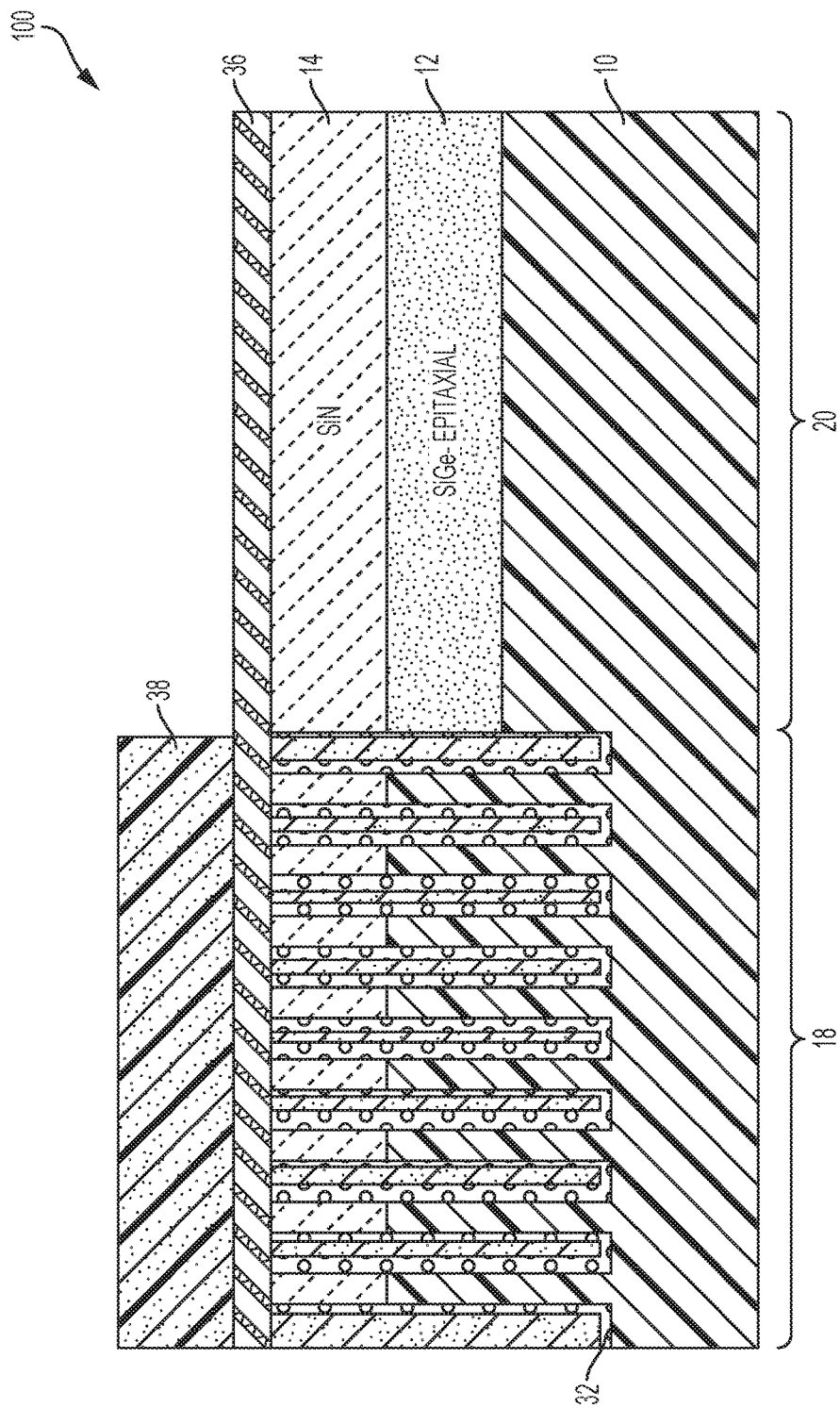
FIG. 9 depicts a cross-sectional view of the structure after an intermediary fabrication stage according to one or more embodiments of the present invention.

FIG. 9 illustrates a cross sectional view of structure 100 after the N-region 18 and the P-region 20 have been planarized by, for example, a chemical mechanical polishing (CMP) to remove a portion of the conformal mask layer 32 from an end of the N-region 18 and an end of the P-region 20. Additionally, a flat oxide spacer 36 has been deposited over the N-region 18 and the P-region 20, and the N-region 18 has been blocked with a second organic planarization layer 38.

Figure 10:
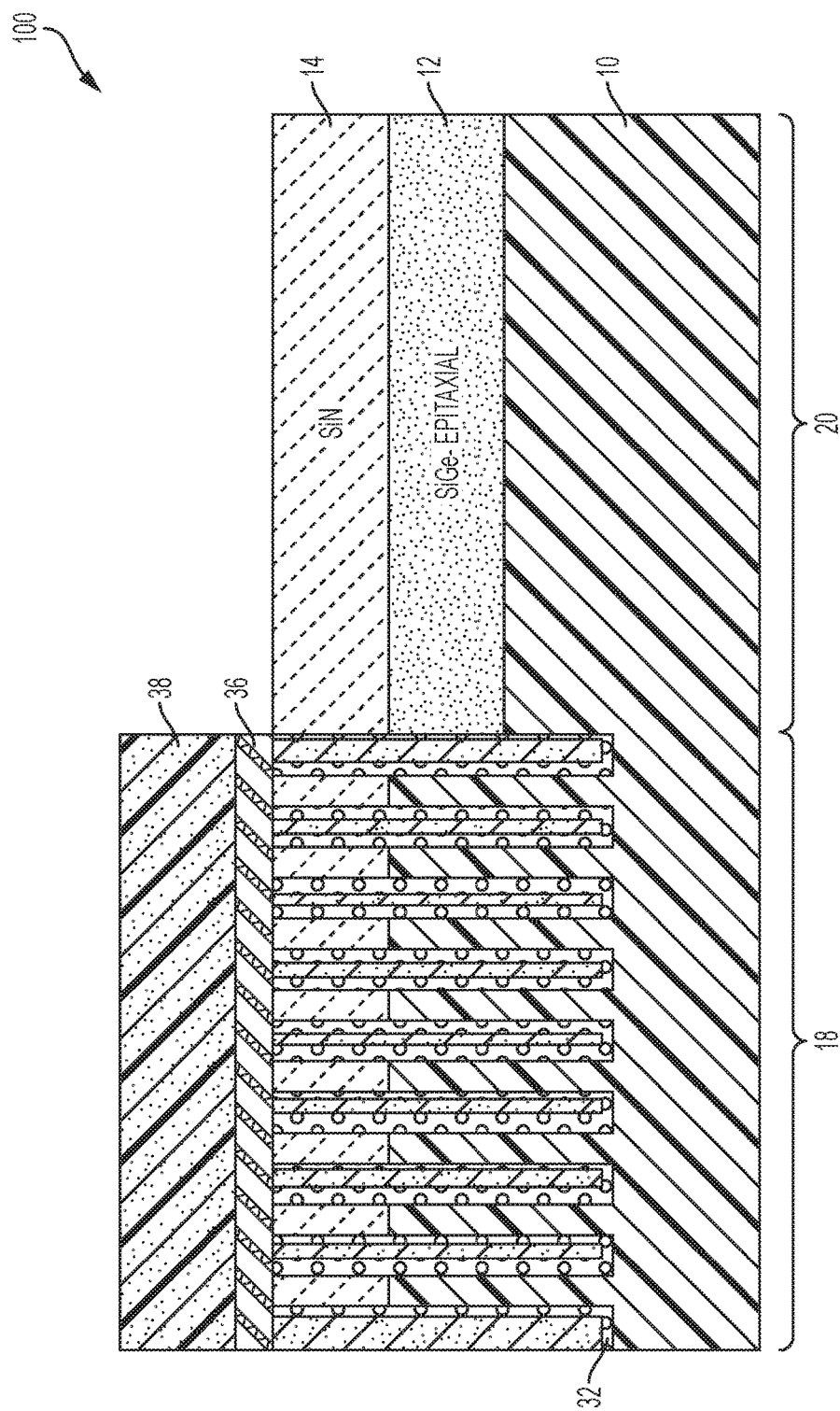
FIG. 10 depicts a cross-sectional view of the structure after an intermediary fabrication stage according to one or more embodiments of the present invention.

FIG. 10 illustrates a cross sectional view of structure 100 after the flat oxide spacer 36 has been removed from the P-region 20. In some embodiments, an RIE removes the portion of the flat oxide spacer 36 from the P-region 20.

Figure 11:
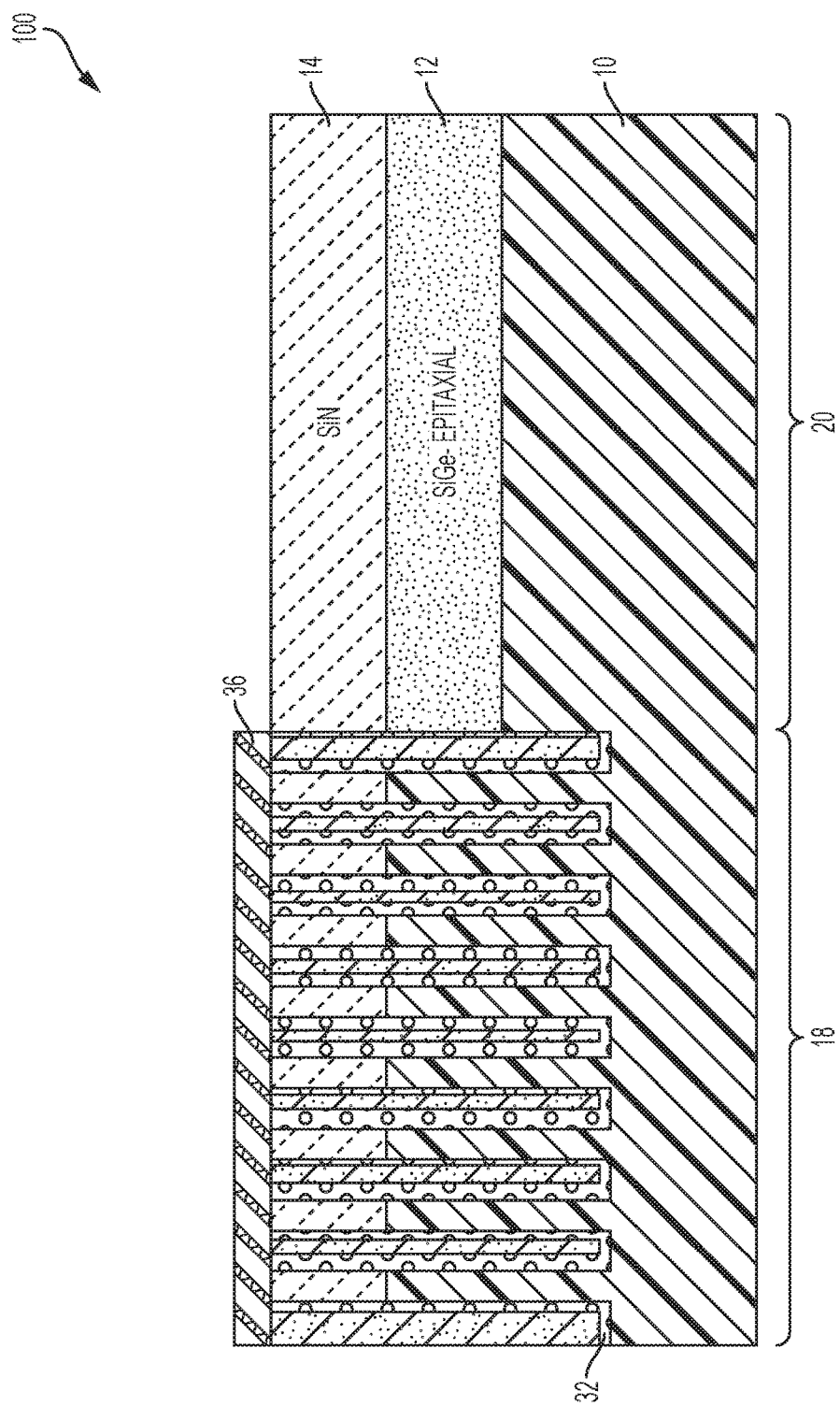
FIG. 11 depicts a cross-sectional view of the structure after an intermediary fabrication stage according to one or more embodiments of the present invention.

FIG. 11 illustrates a cross sectional view of structure 100 after the organic planarization layer 38 has been removed from the N-region 18 of the structure 100.

Figure 12:
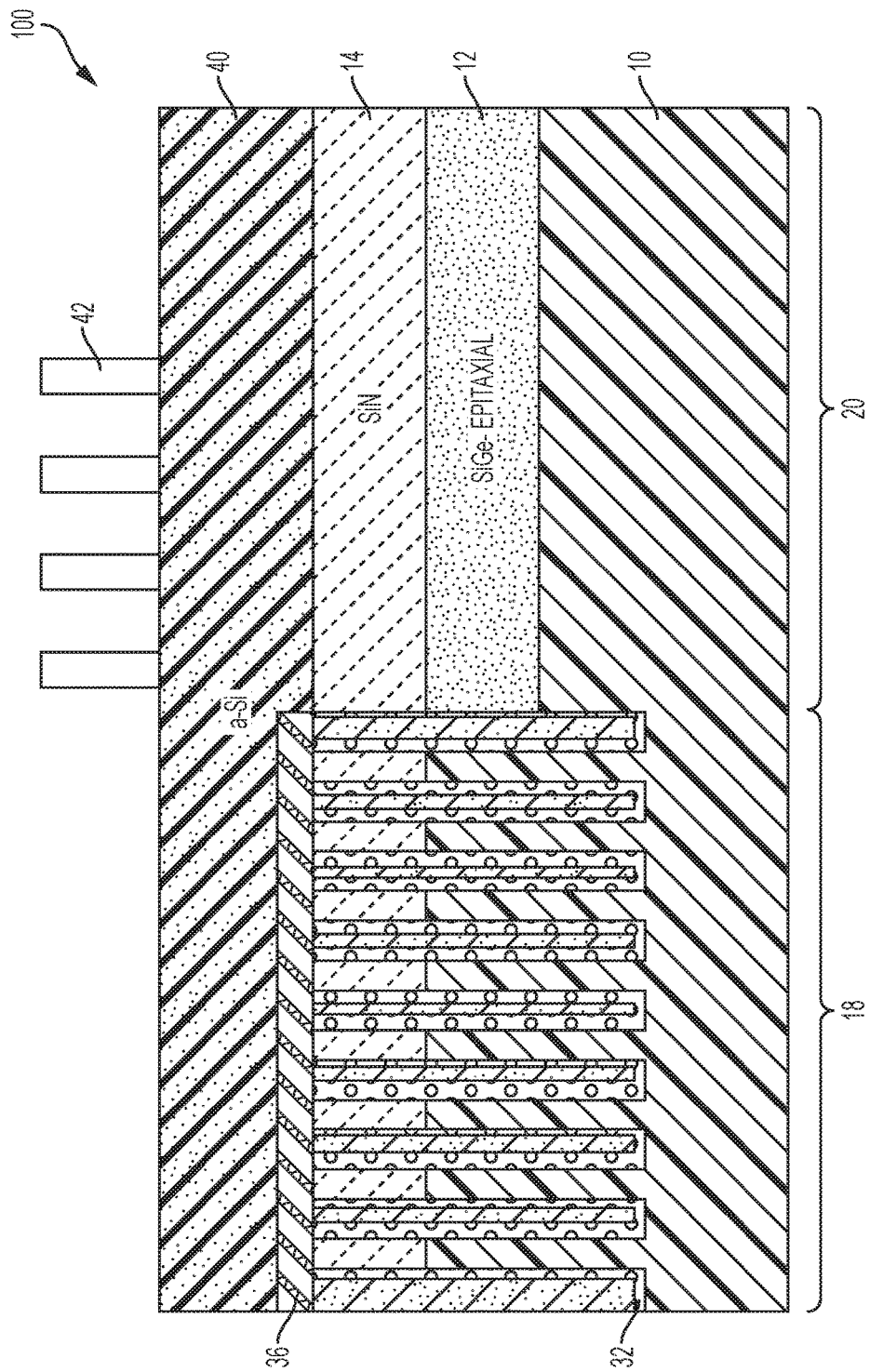
FIG. 12 depicts a cross-sectional view of the structure after an intermediary fabrication stage according to one or more embodiments of the present invention.

FIG. 12 illustrates a cross sectional view of structure 100 after a second amorphous silicon layer 40 is deposited over the N-region 18 and the P-region 20. In an embodiment, a P-mask pattern 42 is formed on the second amorphous silicon layer 40 in the P-region 20 of the structure 100.

Figure 13:
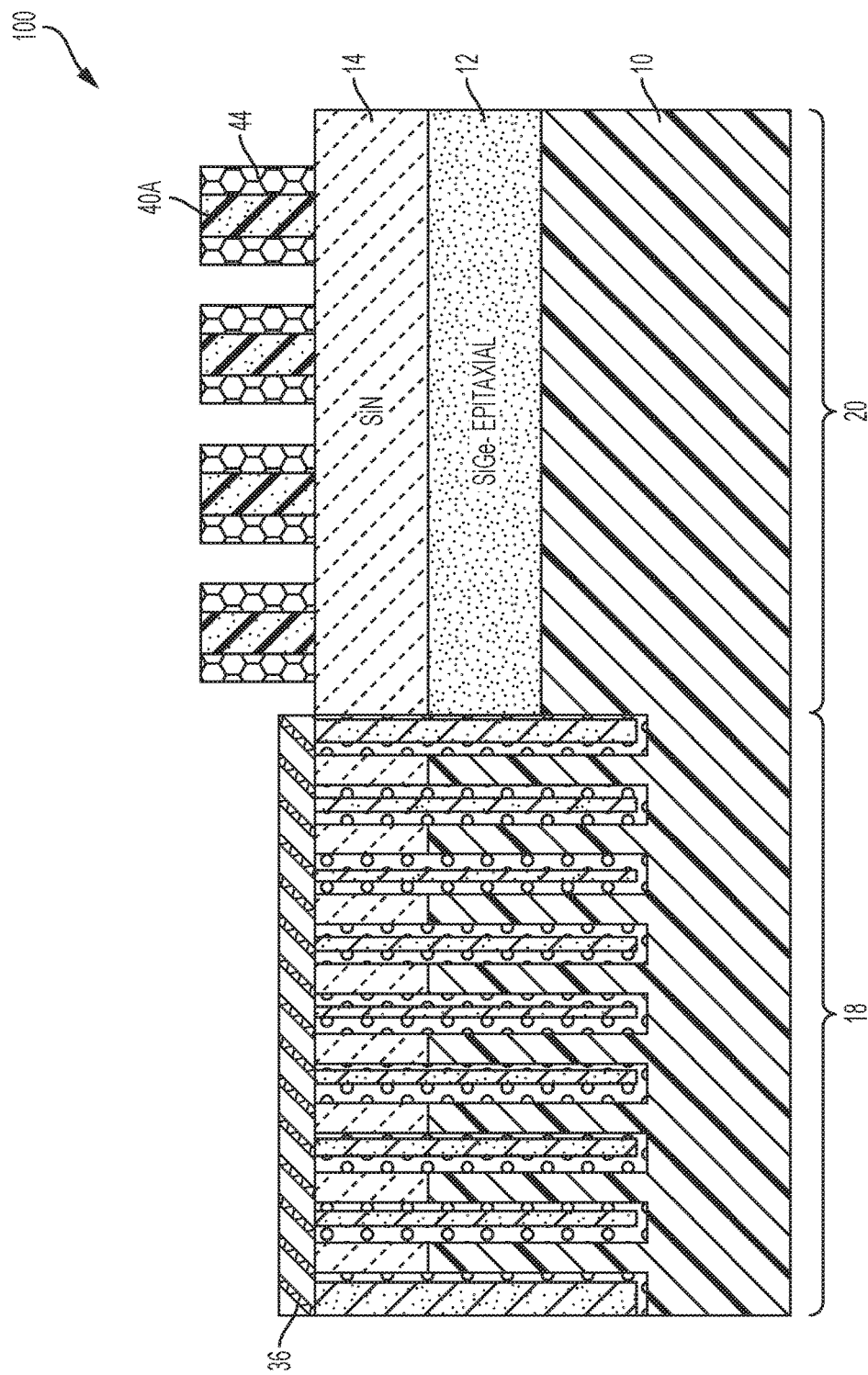
FIG. 13 depicts a cross-sectional view of the structure after an intermediary fabrication stage according to one or more embodiments of the present invention.

FIG. 13 illustrates a cross sectional view of structure 100 after the amorphous silicon layer 40 is removed from the N-region 18, and after patterning and etching the amorphous silicon layer 40 in the P-region 20 to form the amorphous silicon regions 40A to form the P-mask pattern. Additionally, a second oxide spacer 44 has been deposited on the sidewalls of the amorphous silicon regions 40A of the P-mask pattern.

Figure 14:
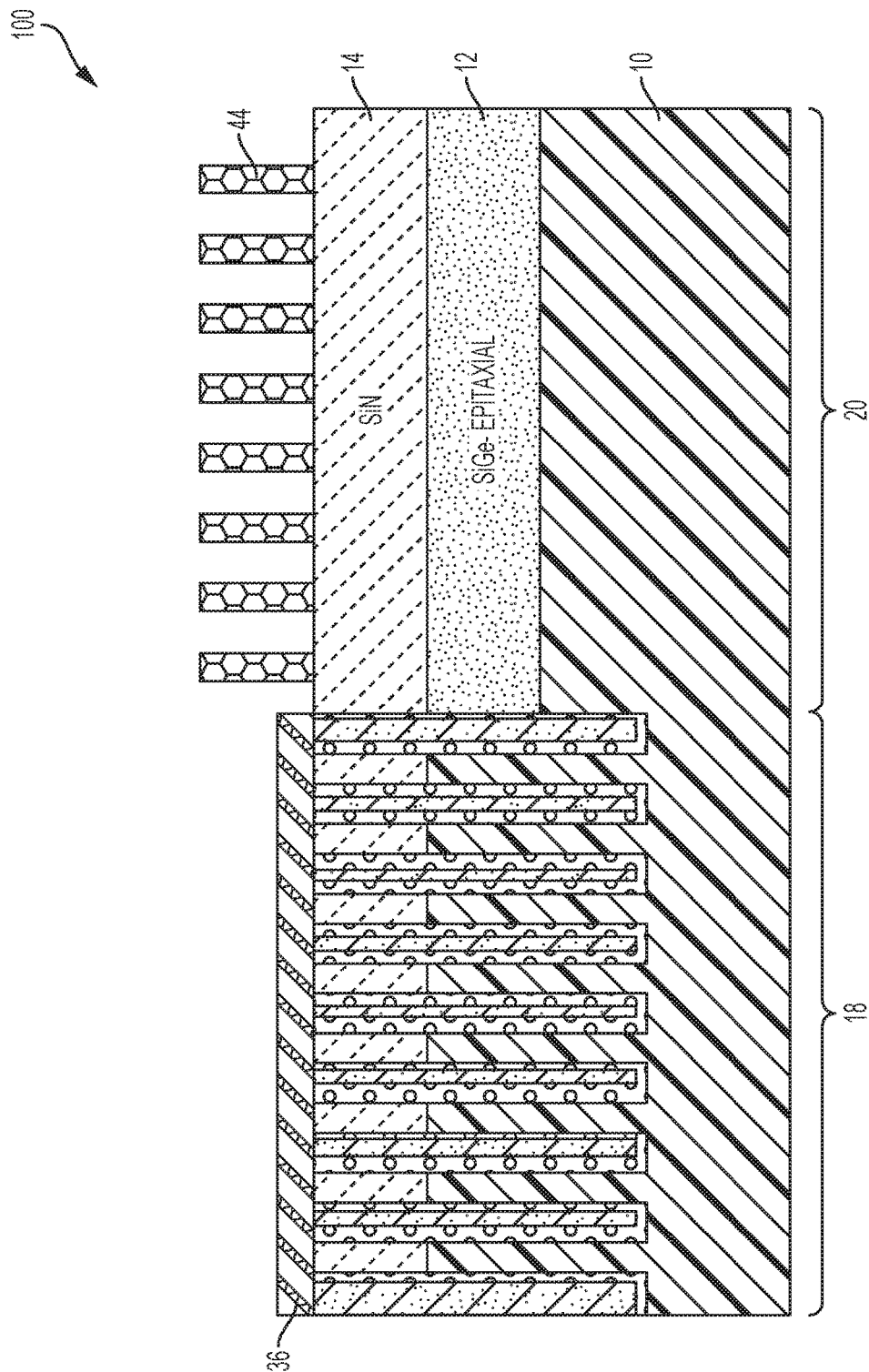
FIG. 14 depicts a cross-sectional view of the structure after an intermediary fabrication stage according to one or more embodiments of the present invention.

FIG. 14 illustrates a cross sectional view of structure 100 after a mandrel pull and etching of the oxide spacers 44.

Figure 15:
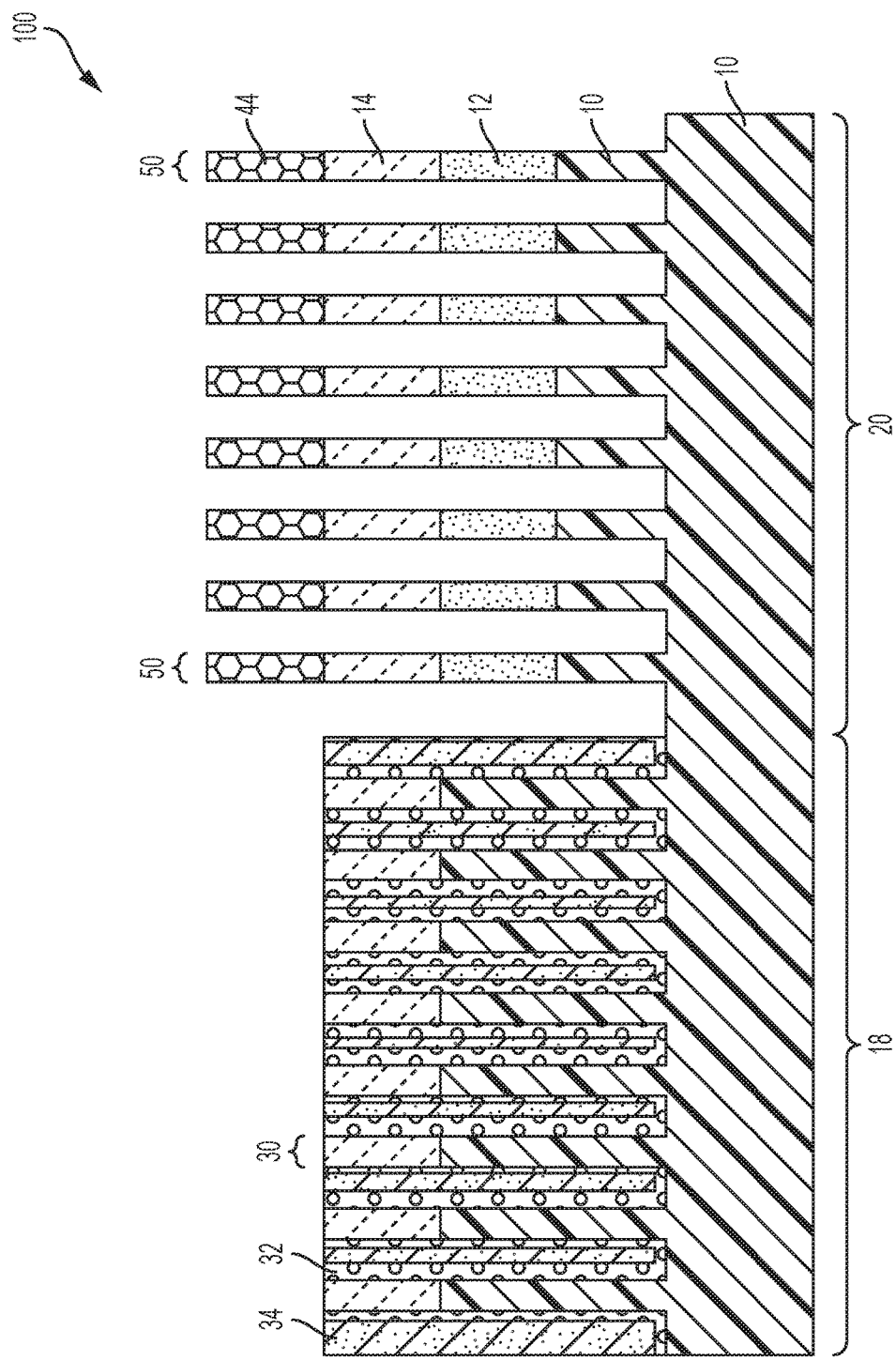
FIG. 15 depicts a cross-sectional view of yet the structure after an intermediary fabrication stage according to one or more embodiments of the present invention.

FIG. 15 illustrates a cross sectional view of structure 100 after etching the dielectric layer 14, the channel region 12, and the substrate 10 of the P-region 20 to form the P-region fins 50. In some embodiments, the flat oxide spacer 36 is also removed from the N-region 18.

Figure 16:
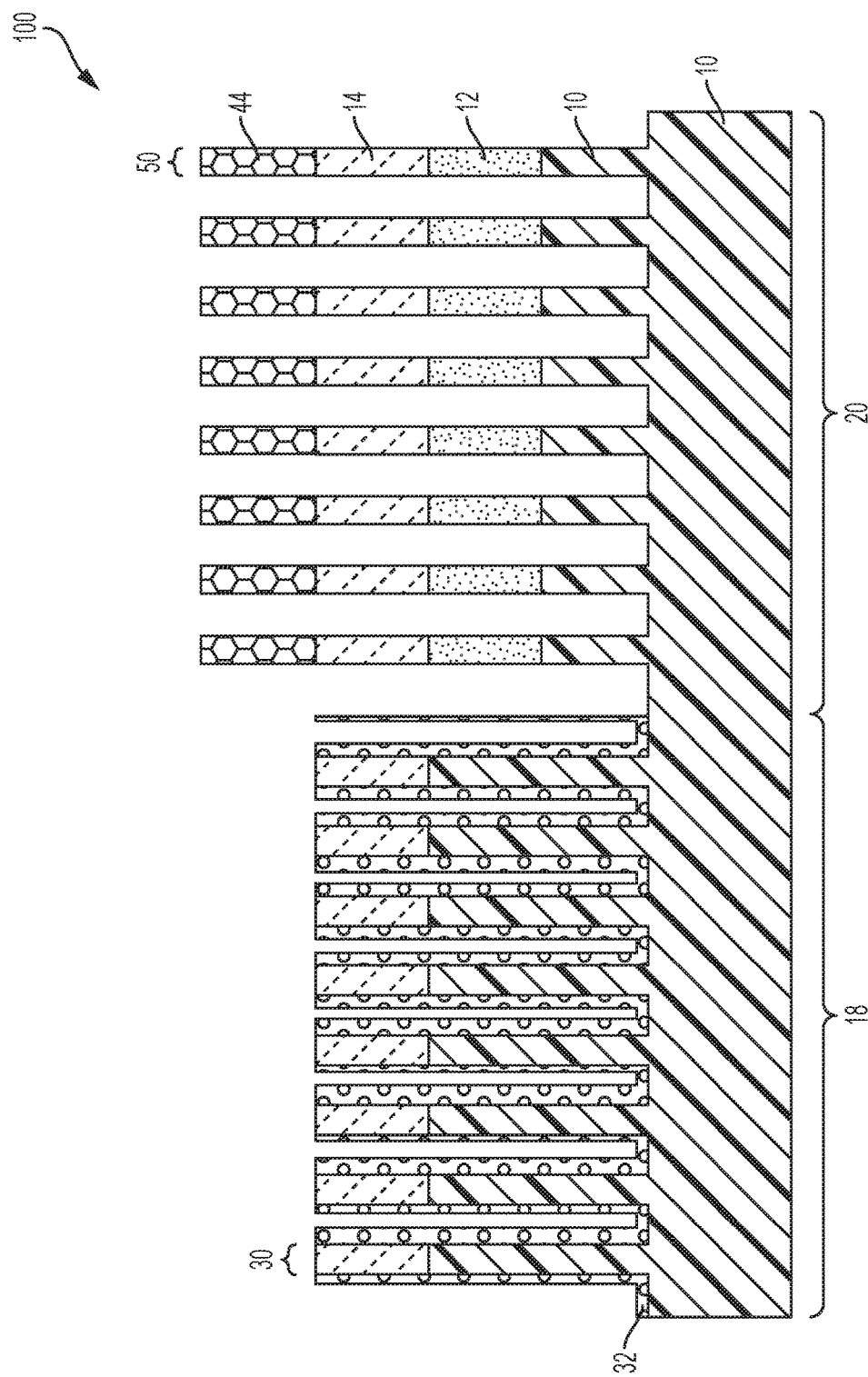
FIG. 16 depicts a cross-sectional view of the structure after an intermediary fabrication stage according to one or more embodiments of the present invention.

FIG. 16 illustrates a cross sectional view of structure 100 after removing the conformal oxide spacer 34 from between the N-region fins 30.

Figure 17:
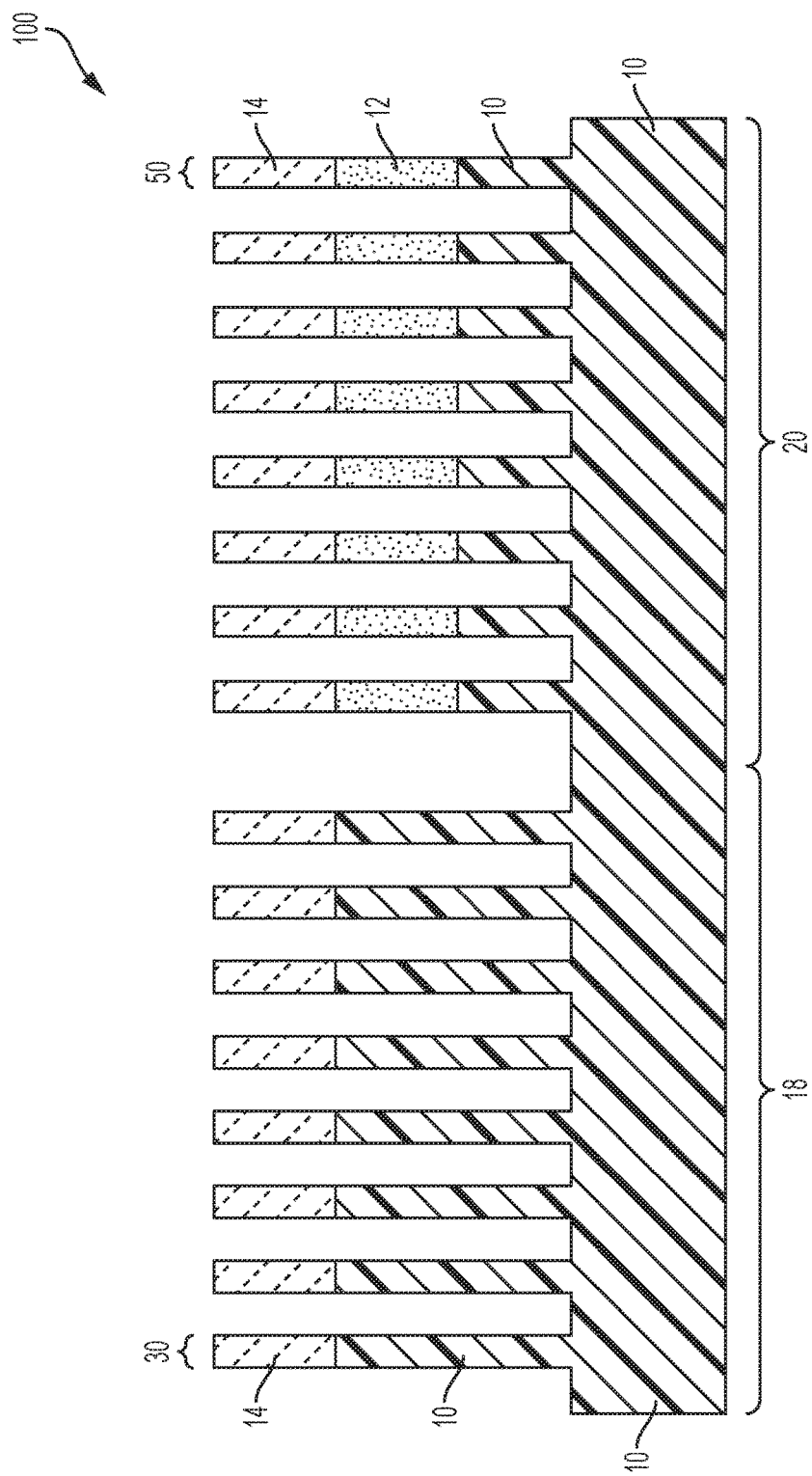
FIG. 17 depicts a cross-sectional view of the structure after an intermediary fabrication stage according to one or more embodiments of the present invention.

FIG. 17 illustrates a cross section view of structure 100 after removing the conformal mask layer 32 from the N-region 18, yielding structure 100 including N-region fins 30 and P-region fins 50.

According to an exemplary embodiment, the critical dimension (CD) of the N-region fins 30 is substantially the same as the CD of the P-region fins 50. According to an exemplary embodiment, the vertical profile of the N-region fins 30 is substantially the same as the vertical profile of the P-region fins 50. Without being bound by theory, if the CD of the N-region fins 30 and the CD of the P-region fins 50 are not matched, then circuit performance and SRAM/logic circuit yield will be degraded. As used herein, the term "substantially the same" means a difference of about 5%, about 4%, about 3%, about 2%, or about 1%.

Figure 18:
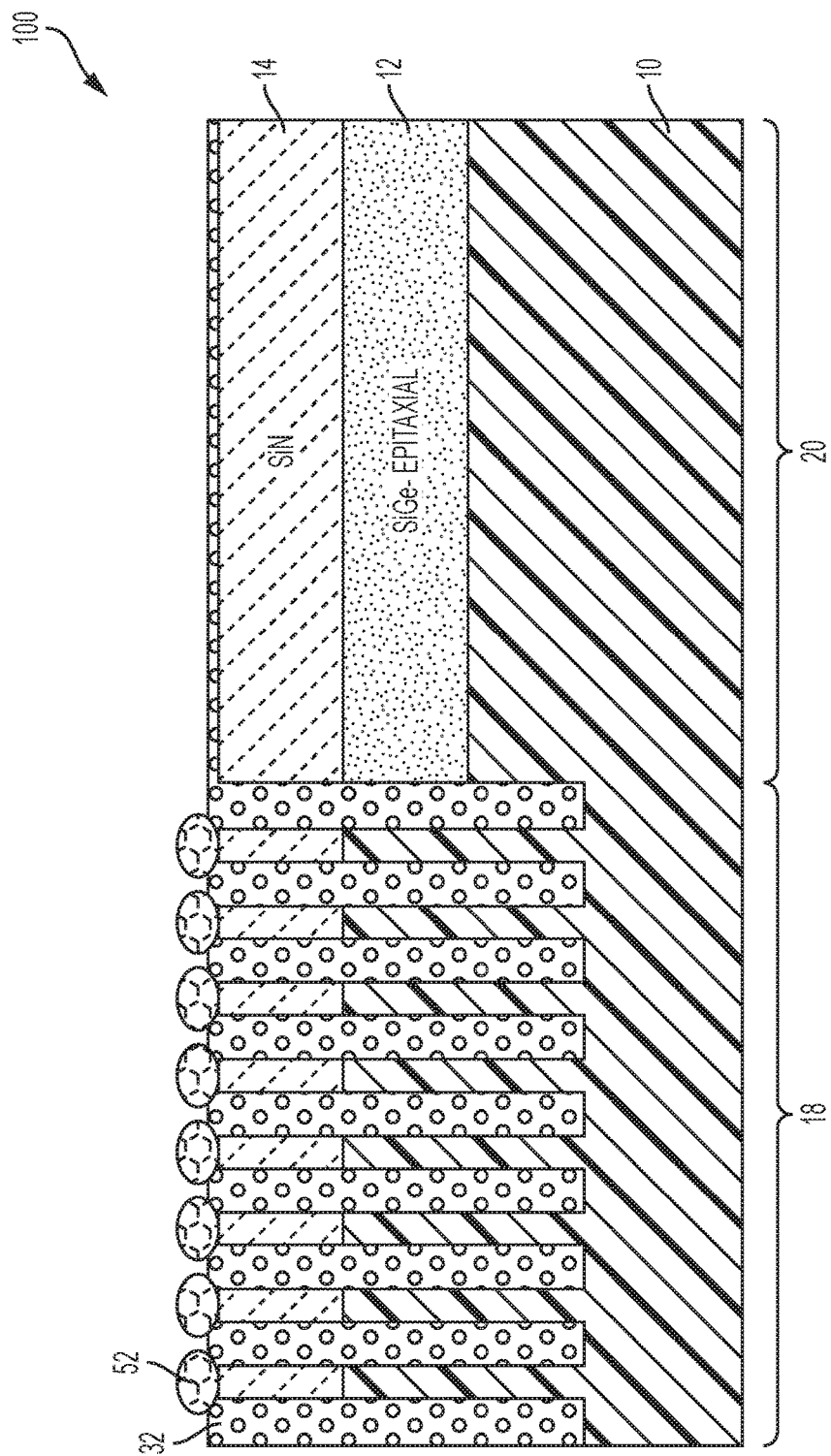
FIG. 18 depicts a cross-sectional view of the structure after an intermediary fabrication stage according to one or more embodiments of the present invention.

In another exemplary embodiment, an alternate method of forming a semiconductor device is provided. FIG. 18 illustrates a cross section view of structure 100 after the conformal mask layer 32 has been deposited in the regions between the N-region fins 30, the conformal mask layer 32 has been pinched off by a pinch-off region 52 in the gaps between the N-region fins 30, and the conformal oxide spacer 24 has been removed as depicted in FIG. 6.

Figure 19:
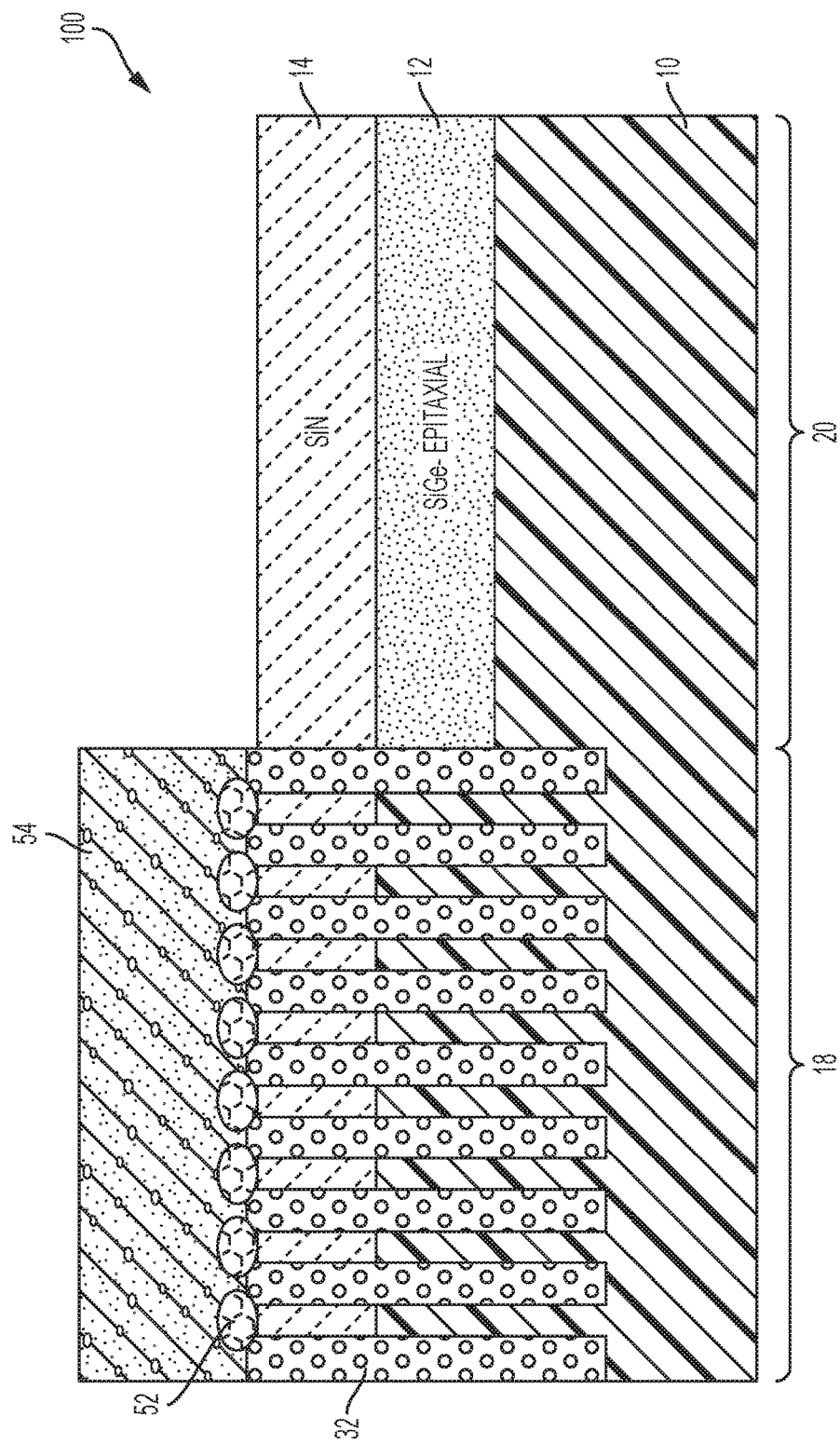
FIG. 19 depicts a cross-sectional view of the structure after an intermediary fabrication stage according to one or more embodiments of the present invention.

FIG. 19 illustrates a cross section view of structure 100 after blocking the N-region 18 with an organic planarization layer 54 and removing the conformal mask layer 32 from the P-region 20.

Figure 20:
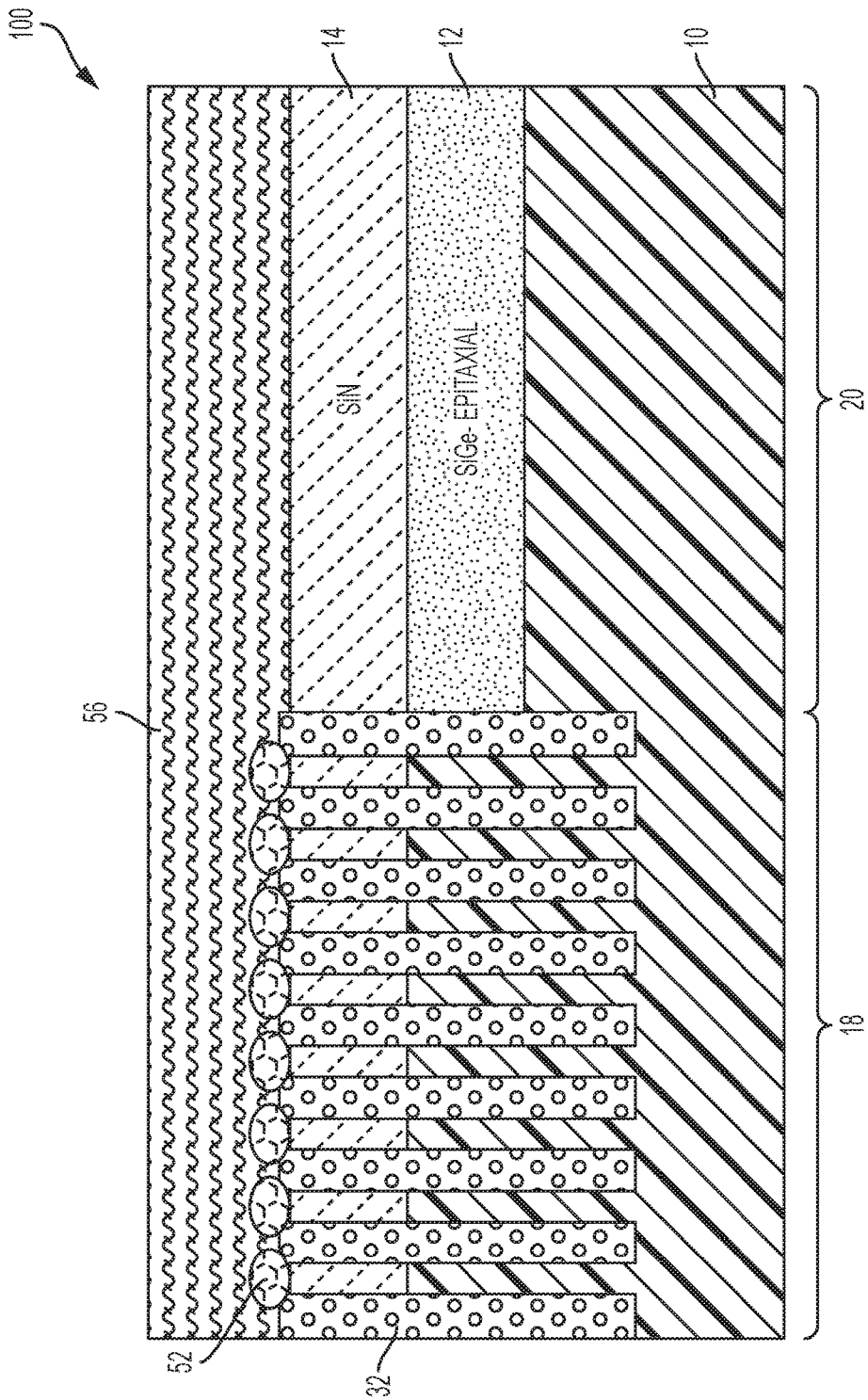
FIG. 20 depicts a cross-sectional view of the structure after an intermediary fabrication stage according to one or more embodiments of the present invention.

FIG. 20 illustrates a cross section view of structure 100 after removing the organic planarization layer 54 from the N-region 18 and depositing a silicon mandrel material 56 over the N-region 18 and the P-region 20.

Figure 21:
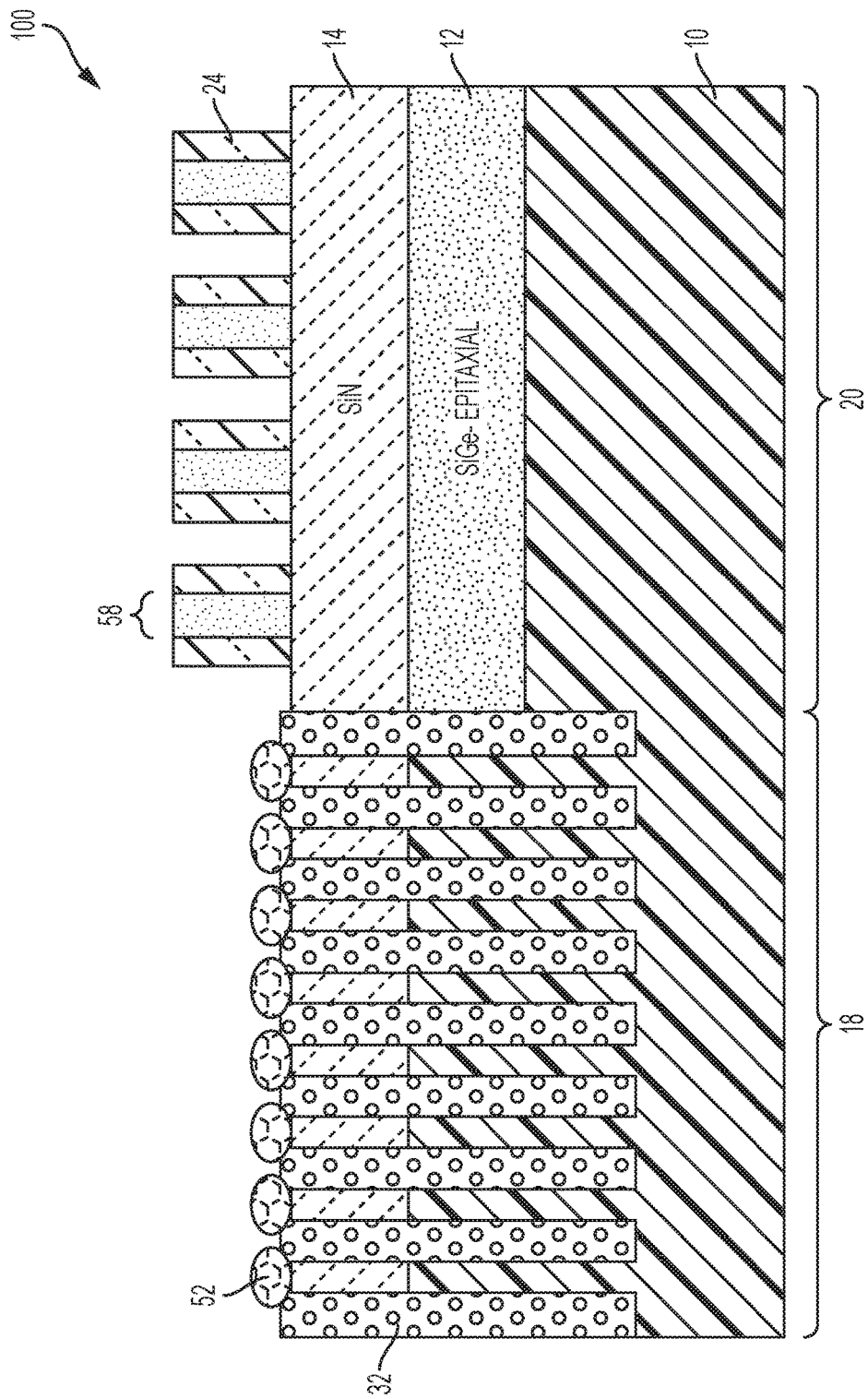
FIG. 21 depicts a cross-sectional view of the structure after an intermediary fabrication stage according to one or more embodiments of the present invention.

FIG. 21 illustrates a cross section view of structure 100 after removing the silicon mandrel material 56, forming a P-mask pattern 58 on the P-region 20, and depositing a conformal oxide spacer 24 over the P-mask pattern 58.

Figure 22:
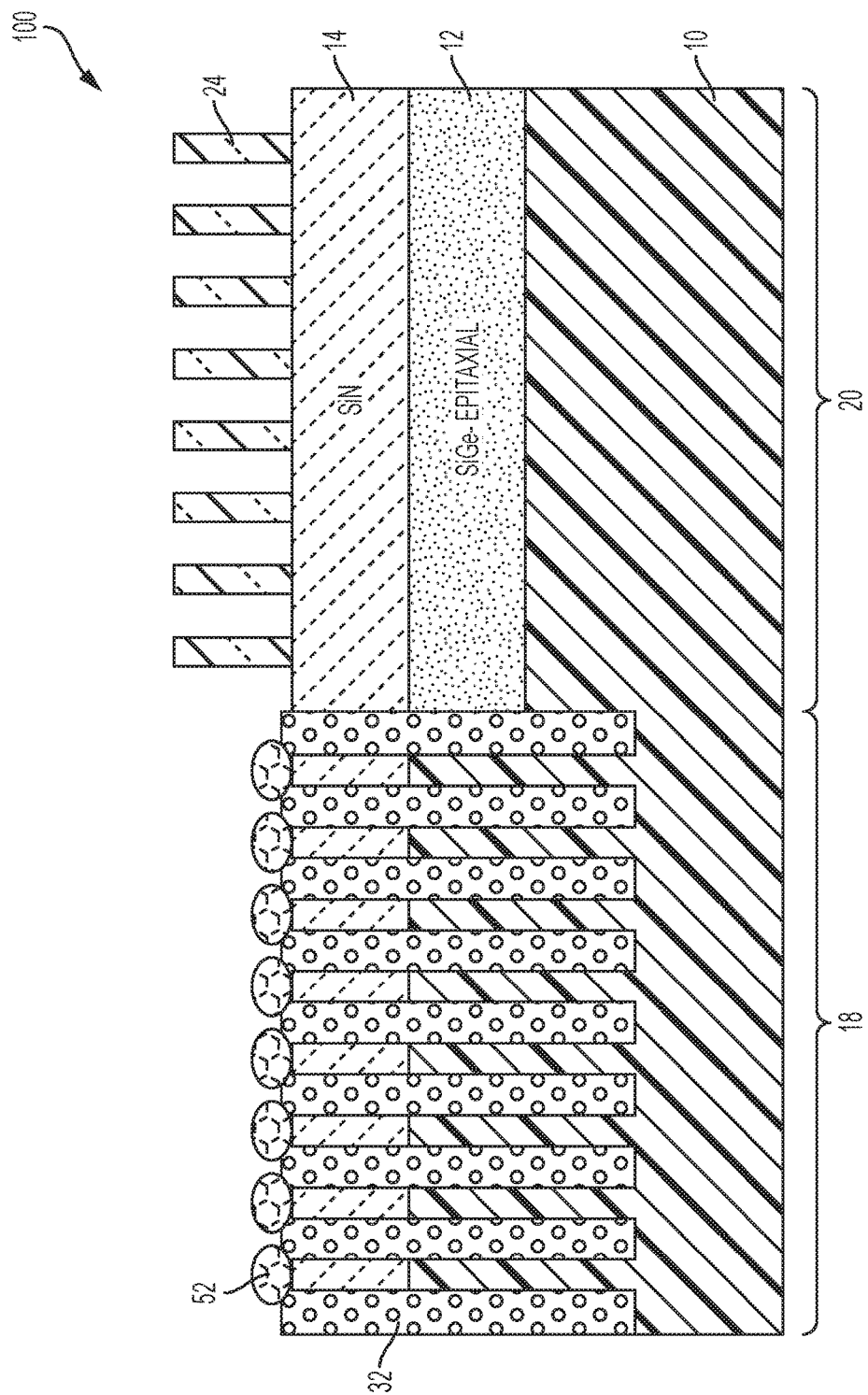
FIG. 22 depicts a cross-sectional view of the structure after an intermediary fabrication stage according to one or more embodiments of the present invention.

FIG. 22 illustrates a cross section view of structure 100 after etching the conformal oxide spacer 24 and pulling the mandrel from the P-region 20.

Figure 23:
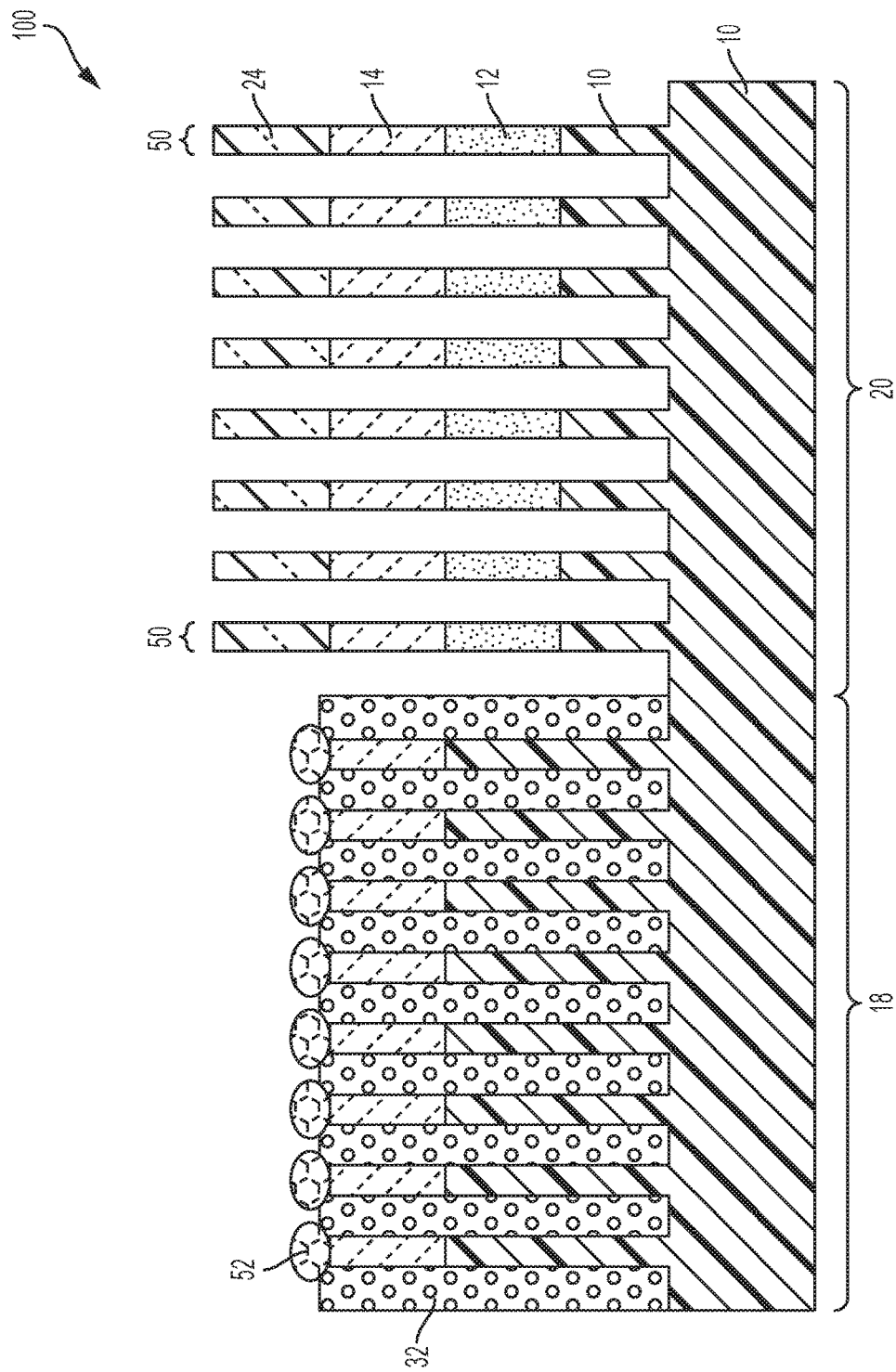
FIG. 23 depicts a cross-sectional view of the structure after an intermediary fabrication stage according to one or more embodiments of the present invention.

FIG. 23 illustrates a cross section view of structure 100 after etching the dielectric layer 14, the channel region 12, and the substrate 10 of the P-region 20 to form the P-region fins 50.

Figure 24:
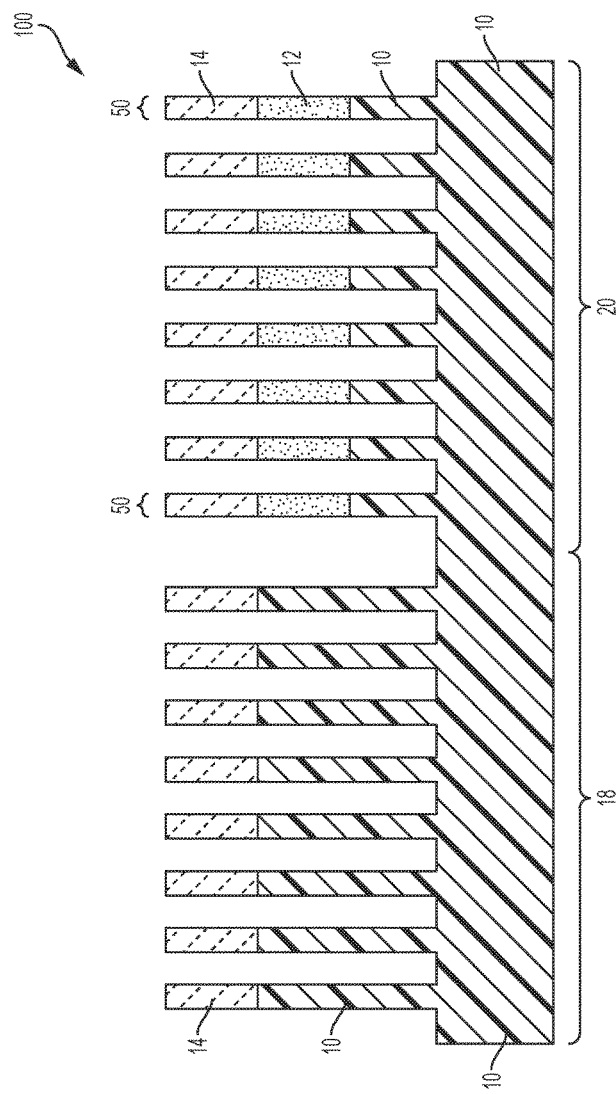
FIG. 24 depicts a cross-sectional view of the structure after an intermediary fabrication stage according to one or more embodiments of the present invention.

FIG. 24 illustrates a cross section view of structure 100 after removing the conformal oxide layer 24 and the conformal mask layer 32 from the N-region 18, yielding structure 100 including N-region fins 30 and P-region fins 50.

In another exemplary embodiment, a semiconductor device prepared according to the described methods is provided. In an embodiment, the semiconductor device includes a first region that includes a first plurality of fins that include a substrate, a channel region, and a dielectric layer. The device also includes a second region that includes a second plurality of fins that include the substrate and the dielectric layer. A critical dimension of the first plurality of fins is substantially the same as a critical dimension of the second plurality of fins.

As used herein, the term "a critical dimension of the first plurality of fins" means that each fin in the first plurality of fins has the critical dimension. Similarly, the term "a critical dimension of the second plurality of fins" means that each fin in the second plurality of fins has the critical dimension.

According to an exemplary embodiment, the first plurality fins are p-type FinFETs and the second plurality of fins are n-type FinFETs.

Figure 25:
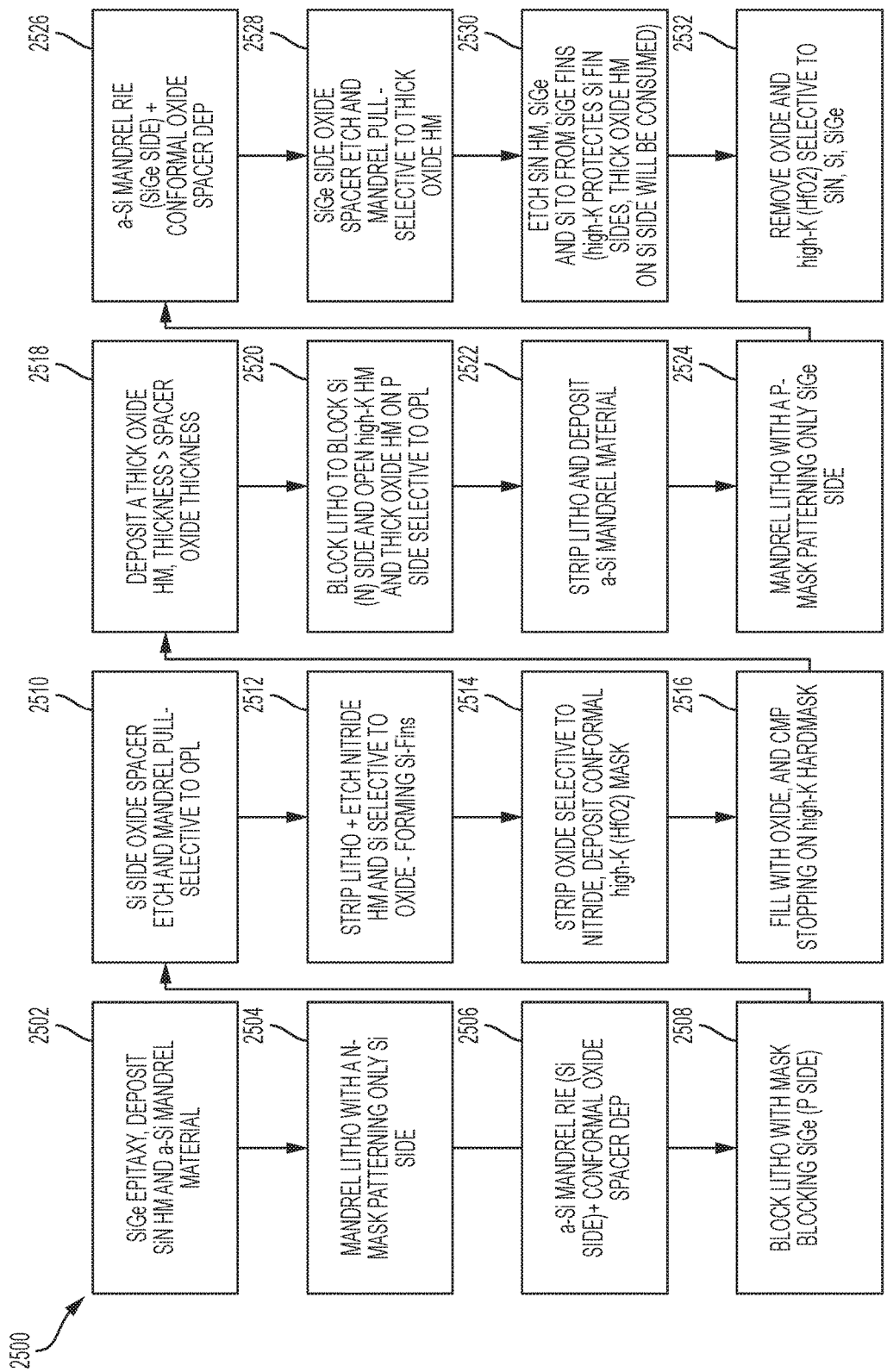
FIG. 25 depicts a flow diagram illustrating a methodology according to one or more embodiments of the present invention.

FIG. 25 depicts a flow diagram illustrating a method according to one or more embodiments of the present invention. Starting from the top left of FIG. 25, a SiGe material is grown epitaxially, a SiN dielectric layer is deposited, and a Si mandrel material is deposited (2502). The Si mandrel is patterned with an N-mask patterning of the Si-side of the device (2504). The Si mandrel material is then removed by RIE and a conformal oxide spacer is deposited (2506). A mask blocking the SiGe material is then deposited. (2508). The Si-side oxide spacer is then etched and the mandrel is pulled in a manner that is selective to OPL (2510). Next, strip lithography and etching of the nitride dielectric layer is performed to form Si-Fins (2512).

The oxide is stripped from the nitride material, and a conformal mask layer is deposited (2514). The region between the Si-Fins is then filled with an oxide (2516). A thick oxide spacer is deposited, having a thickness that is greater than the thickness of the conformal oxide spacer (2518). The N-Side is then blocked using lithography, and the conformal mask layer and the thick oxide spacer are removed from the P-Side (2520). Strip lithography is then performed and a Si mandrel material is deposited (2522). The Si mandrel is modified by lithography with a P-mask patterning of the SiGe side of the device (2524). The Si mandrel is then removed by RIE and a conformal oxide spacer is deposited (2526. The SiGe side is then etched and the mandrel pulled to remove the thick oxide spacer (2528). The SiN, SiGe, and Si are then etched to form the SiGe-Fins, while the conformal mask layer protects the Si Fins (2530). Finally, the conformal oxide spacer and the conformal mask layer are removed (2532).

In another embodiment, the oxide is stripped from the nitride material, and a conformal mask layer is deposited to fill and pinch off in gaps between the Si Fins (2604). FIG. 26 depicts flow diagram illustrating another method according to one or more embodiments of the present invention. The Si Side is then blocked by OPL and the conformal mask layer is removed from the P Side (2606). Lithography then removes the OPL block and a Si mandrel material is deposited (2608). The Si mandrel is formed into a P-mask pattern on the SiGe side (2610). The Si mandrel is then removed by RIE and a conformal oxide spacer is deposited around the P-mask pattern (2612). The conformal oxide spacer is then etched and the mandrel pulled (2614). The SiN, SiGe, and Si are then etched to form the SiGe-Fins (2616). Finally, the conformal oxide and the conformal mask layer are removed (2618).

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
    blocking a first region of a wafer;
    forming a plurality of fins in a second region of the wafer;
    depositing a conformal mask layer over the plurality of fins in the second region;
    unblocking the first region of the wafer;
    blocking the second region of the wafer;
    forming a plurality of fins in the first region of the wafer;
    unblocking the second region of the wafer; and
    removing the conformal mask layer.

2. The method of claim 1, wherein the first region of the wafer comprises a substrate, a channel region, and a dielectric layer.

3. The method of claim 1, wherein the second region of the wafer comprises a substrate and a dielectric layer.

4. The method of claim 1, wherein the conformal mask layer comprises a high-k material.

5. The method of claim 4, wherein the high-k material comprises hafnium oxide.

6. The method of claim 1, wherein a critical dimension of the plurality of fins in the first region of the wafer is substantially the same as a critical dimension of the plurality of fins in the second region of the wafer.

7. The method of claim 1, further comprising depositing an oxide fill between the plurality of fins in the second region after depositing the conformal mask layer.

8. The method of claim 1, wherein blocking the first region of the wafer further comprises depositing a conformal oxide spacer and an organic planarization layer over the first region.

9. The method of claim 1, wherein forming the plurality of fins in the second region of the wafer further comprises etching a substrate and a dielectric layer to form the plurality of fins in the second region of the wafer.

10. The method of claim 9, wherein the dielectric layer comprises a nitride material.

11. The method of claim 1, wherein forming the plurality of fins in the first region of the wafer further comprises etching a substrate, a dielectric layer, and a channel material to form the plurality of fins in the first region of the wafer.

12. The method of claim 1, further comprising epitaxially growing a channel material on a substrate to form a channel region.

13. The method of claim 12, wherein the channel material comprises an alloy having the formula $Si_{(1-x)}M_x$, wherein M is at least one element selected from tin, boron, aluminum, gallium, indium, nitrogen, phosphorous, arsenic, antimony, and bismuth, and wherein $0<x<1$.

14. The method of claim 1, wherein depositing the conformal mask layer over the plurality of fins in the second region further comprises filling a region between the plurality of fins in the second region with the conformal mask layer and pinching off at least a portion of the conformal mask layer from above the plurality of fins.

* * * * *